United States Patent [19]

Tada et al.

[11] Patent Number: 5,580,466
[45] Date of Patent: Dec. 3, 1996

[54] METAL PLATE PROCESSING METHOD, LEAD FRAME PROCESSING METHOD, LEAD FRAME, SEMICONDUCTOR DEVICE MANUFACTURING METHOD, AND SEMICONDUCTOR DEVICE

[75] Inventors: Nobuhiko Tada, Ushiku; Naoki Miyanagi, Ibaraki-ken; Yoshiaki Shimomura, Ibaraki-ken; Shigeyuki Sakurai, Ibaraki-ken; Yoshinari Nagano, Ibaraki-ken, all of Japan

[73] Assignee: Hitachi Construction Machinery Co., Ltd., Tokyo, Japan

[21] Appl. No.: 343,446

[22] PCT Filed: Apr. 4, 1994

[86] PCT No.: PCT/JP94/00550

§ 371 Date: Nov. 23, 1994

§ 102(e) Date: Nov. 23, 1994

[87] PCT Pub. No.: WO94/24705

PCT Pub. Date: Oct. 27, 1994

[30] Foreign Application Priority Data

Apr. 14, 1993 [JP] Japan .................. 5-087446
Apr. 16, 1993 [JP] Japan .................. 5-089806

[51] Int. Cl.⁶ ................ H01L 21/00; B44C 1/22; C23F 1/00
[52] U.S. Cl. .................. 216/3; 216/65; 257/673; 437/220
[58] Field of Search ............ 216/14, 41, 52, 216/53, 65, 59, 83; 257/673; 437/220; 361/421; 829/827

[56] References Cited

U.S. PATENT DOCUMENTS 4,786,358  11/1988  Yamazaki et al. ............. 216/65 X
5,088,008  2/1992  Takeyama et al. .............. 216/65 X

FOREIGN PATENT DOCUMENTS 59-072754  4/1984  Japan .
62-218587  9/1987  Japan .
2-038587   2/1990  Japan .
2-247089   10/1990 Japan .
3-123063   5/1991  Japan .
4-037493   2/1992  Japan .
5-152482   6/1993  Japan .
5-190718   7/1993  Japan .
6-179088   6/1994  Japan .

*Primary Examiner*—William Powell
*Attorney, Agent, or Firm*—Fay, Sharpe, Beall, Fagan, Minnich & McKee

[57] ABSTRACT

An object of the present invention is to, in methods of processing metal plates and lead frames, enable workpieces to be finely processed into a satisfactory configuration with high dimensional accuracy without suffering the effect of heat produced under irradiation of a laser beam. According to the present invention, resist films (1) are first coated on both surfaces of a metal plate (1), and a laser beam (202) is then irradiated to the metal plate (101) from surfaces of the resist films (1) to form a multiplicity of discontinuous through holes (3) in line, while leaving joints (6) as not-processed portions between the adjacent through holes (3). Openings (2) formed in each resist film (1) by the laser cutting are joined with each other to serve as an etching pattern. Next, etching is carried out to etch side walls (6) defining the through holes and also to remove the joints (6), thereby interconnecting the through holes (3) formed in line to form a gap (303a) of a desired shape. Instead of forming the through holes (3) and the joints (6) in the metal plate (101) by irradiating the laser beam (202), non-penetrating cut grooves (51) may be formed in the metal plate (101) with a joint (52) left as a non-processed portion at the bottoms of the cut grooves, followed by removing the joint by etching.

33 Claims, 16 Drawing Sheets

5,580,466

METAL PLATE PROCESSING METHOD, LEAD FRAME PROCESSING METHOD, LEAD FRAME, SEMICONDUCTOR DEVICE MANUFACTURING METHOD, AND SEMICONDUCTOR DEVICE

FIELD OF THE INVENTION

The present invention relates to a metal plate processing method capable of finely processing metal plates into a satisfactory configuration, a method of processing lead frames utilizing the metal plate processing method, the lead frame itself, a method of manufacturing semiconductor devices using such lead frames, and the semiconductor device itself.

BACKGROUND OF THE INVENTION

Lead frames comprise metal plates in which fine patterns such as inner leads and outer leads are processed. After mounting a semiconductor chip on the lead frame, terminals of the semiconductor chip and the inner leads are electrically connected to each other.

Recently, there has been an even stronger demand for a higher packing density and higher integration of semiconductor chips. Corresponding to such a demand, lead frames for mounting semiconductor chips thereon have also been developed which are of fine shapes and highly accurate dimensions. In particular, great weight has been given to increasing the number of pins per lead frame. With an increase in the number of pins per lead frame, a processing technique is required which can process distal end portions of inner leads to be smaller in pitch and finer in shape.

Conventional techniques for forming such lead frames having a number of pins and a narrow pitch from metal plates have been primarily practiced by a process utilizing chemical corrosion, particularly wet etching using an etchant (hereinafter referred to simply as etching). By that conventional processing method, lead frames having satisfactorily fine configurations can be easily processed.

Meanwhile, there is also known a method of processing metal plates, particularly lead frames, in combination of etching and laser cutting as disclosed in JP-A-3-123063 and JP-A-4-37493. The processing method disclosed in the former JP-A-3-123063 comprises cutting the portions having a narrow pitch, such as inner leads, by irradiation of a laser beam, and processing the portions not having such a narrow pitch, such as outer leads, by punching or etching. The processing method disclosed in the latter JP-A-4-37493 comprises etching a part of the total amount which is to be processed in the direction of plate thickness to form a recess having a curved inner surface. Then a post-cutting operation is undertaken the remaining part, which has been left not penetrated by the etching, by irradiation of a laser beam so that the remaining part is thoroughly penetrated to form inner leads having a narrow pitch.

The laser cutting employed in the above methods is suitable for fine processing because a laser beam can be condensed into a very small diameter, enabling metal plates, particularly narrow-pitch inner leads of lead frames, to be processed easily and reliably.

SUMMARY OF THE INVENTION

When processing fine portions of a metal plate from both sides by etching only, the metal plate is required to be etched half or more of the plate thickness from each side in order to penetrate the metal plate in the direction of plate thickness. However, since chemical corrosion such as etching is isotropic, the processed portion is also corroded in the direction of plate plane simultaneously by the same amount as in the direction of plate thickness (hereinafter referred to as side etching) and the finally formed gap has a width greater than the plate thickness. In other words, when metal plates are finely processed by etching, there exists a limit in that the processing and etching cannot penetrate the metal plate with a gap width less than the plate thickness. When metal plates are etched from one side, a portion corroded by side etching is further increased, making it more difficult to achieve fine processing.

On the other hand, with the methods disclosed in JP-A-3-123063 and JP-A-4-37493, by taking advantage of the feature of laser cutting, fine portions of lead frames having a narrow pitch for use in a high-density and high-integration semiconductor, for example, can be processed beyond the above-mentioned limit in processing by etching. These prior art methods, however, have a drawback that thermal deformations are caused due to the heat produced under irradiation of a laser beam, and hence satisfactorily finished configurations and highly accurate dimensions cannot be realized. Also, molten metal generated during laser cutting is deposited as drosses on the end faces after the cutting, which may result in a degradation in dimensional accuracy and a short circuit between leads. Further, since the thermal effect due to laser cutting changes properties of a material of metal plates to form a affected layer, deformations may occur due to residual strains and residual stresses produced in the affected layer. Additionally, an oxide coating is formed on the plate surface heated up to high temperature during laser cutting, leading to a contact failure when terminals are electrically connected. Thus, in the two prior art methods discussed above, no considerations is paid to the problems incidental to using laser cutting as one kind of thermal process.

Furthermore, the method disclosed in JP-A-4-37493 is disadvantageous in that, because the incompletely processed part which has been left unpenetrated by etching is penetrated by irradiation of a laser beam, a portion of the metal plate which is originally flat is processed to have a curved surface in the final condition, resulting in an unsatisfactory sectional shape. Accordingly, flat portions necessary for the connection of terminals are not left sufficiently, making it difficult to electrically connect the inner leads to terminals of a semiconductor chip by wire bonding or the like in a later step.

The above-described problems are not limited to processing of lead frames, but equally apply to general cases where thin metal plates are finely processed.

An object of the present invention is to provide a metal plate processing method capable of finely processing metal plates into a satisfactory configuration with high dimensional accuracy without suffering the effect of heat produced under irradiation of a laser beam, a method of processing lead frames utilizing the metal plate processing method, the lead frame itself, a method of manufacturing semiconductor devices using such lead frames, and the semiconductor device itself.

To achieve the above object, according to the present invention, there is provided a metal plate processing method for forming gaps in a thin metal plate, wherein the method comprises a first step of carrying out laser cutting by irradiating a laser beam to said metal plate to form cut grooves such that a joint having a small thickness is left in part of wall surfaces of said cut grooves, and a second step of chemically corroding the wall surfaces of said cut grooves to remove said joint to thereby form a gap in said metal plate.

With the present invention thus arranged, in the first step, a laser beam is irradiated to a metal plate and cut grooves are formed in the metal plate due to the heat produced under irradiation of the laser beam. As the laser beam can be condensed into a very small diameter, fine portions can be surely processed. At this time, the laser cutting is performed in such a manner as to leave a joint having a small thickness in part of wall surfaces of the cut grooves. Stated otherwise, in this step, the metal plate is not cut into a final configuration to be finally obtained by the laser beam, but cut into the discontinuous form while leaving the joints. As compared with the prior art in which the final desired configuration is formed by using a laser beam only, therefore, the amount to be cut by the laser beam can be reduced and the area suffering the effect of the heat produced by the laser beam can be made very small so as to reduce resultant thermal deformations. Also, in the case of forming the final desired configuration by using a laser beam only, a thermal deformation caused by irradiation of the laser beam may affect a next laser cutting step such that thermal deformations accumulate so as to eventually cause a substantial error in dimension. However, such a disadvantage can be eliminated in the present invention. Furthermore, since the cut grooves are discontinuously present in line during the processing, the presence of the joints between the adjacent cut grooves keeps the metal plate in a highly rigid state, allowing the metal plate to be easily handled. This is also effective to prevent deformations and manufacturing errors from occurring during the processing.

In the second step, wall surfaces of the cut grooves are chemically corroded such that the joints are also corroded to become thinner and the cut grooves are extended correspondingly. Then, the joints are completely removed to finally form a gap. At this time, drosses deposited in the vicinity of the laser-cut portions, affected layers formed in the wall surfaces of the cut grooves, and oxide coatings formed on the plate surfaces are simultaneously removed so that each gap in the metal plate has smooth wall surfaces. Thus, since chemical corrosion as a non-thermal process is finally carried out, the thermal effect is minimized, resulting in a satisfactorily finished configuration of the metal plate and improved dimensional accuracy. Additionally, the post-process that may impair the dimensional accuracy after the processing is not required, and hence the processing accuracy is maintained in good condition.

In the above metal plate processing method, preferably, said cut grooves formed in said first step are through holes discontinuously formed in said metal plate in line, and said joint is an uncut portion left between adjacent pairs of said through holes.

With such a feature, during the chemical corrosion in the second step, the side walls of each of the through holes formed by the laser cutting are etched substantially evenly in the direction of plate thickness so that the through holes are extended. As a result, the through holes are joined with each other to finally form a gap.

Meanwhile, there has been a problem that a conventional process using etching only has a limit in processing as described above and, particularly when processing fine portions of a metal plate from both sides by etching only, the metal plate cannot be penetrated with a gap width less than the plate thickness. The problem is solved by the present invention as follows.

On condition that the cut grooves are through holes discontinuously formed in the metal plate in line and the joints are not-processed portions left between the adjacent through holes, the thickness of the joints formed by the laser cutting in the first step is preferably selected to be smaller than the thickness of the metal plate. By so selecting, before the metal plate is etched away in the second step in the direction of width of the through holes in line by an amount of about half the plate thickness on each side of the hole, the etching is also progressed in the direction of the line of the through holes to such an extent that the joints between the adjacent through holes are removed. In other words, at the time the through holes in line are joined with each other, the amount by which the metal plate has been etched in the direction of width of the through holes can be smaller than the thickness of the metal plate. The width of the gap to be finally processed is given by the sum of the size of the through holes having already been formed by the laser cutting and the size by which the metal plate is chemically corroded in the direction of width of the through holes. However, since the laser beam can be condensed into a very small diameter, the width of the gap in the finished configuration can be made substantially equal to or less than the thickness of the metal plate. Consequently, it is possible to form a gap having a narrower width than the processing limit in the prior art.

In the above metal plate processing method, preferably, said cut grooves formed in said first step are cut grooves formed not to penetrate said metal plate in the direction of plate thickness, and said joint is an uncut portion left at the bottom portions of said cut grooves.

With such a feature, during the chemical corrosion in the second step, the cut grooves formed by the laser cutting are corroded and extended so that the joints at the bottom portions of the not-penetrating cut grooves are finally removed. Accordingly, the cut grooves not yet penetrating the metal plate in the direction of plate thickness now penetrate therethrough to finally define a gap.

Preferably, the not-penetrating cut grooves are formed from both sides of the metal plate. This enables the metal plate to be corroded from both sides at the same time. Accordingly, the time required for the chemical corrosion is shortened and the amount corroded by side etching (hereinafter a similar phenomenon occurring during chemical corrosion other than wet etching will also be referred to as side etching) is reduced. Furthermore, there has been a problem that a conventional process using etching only has a limit in processing as described above and, particularly when processing fine portions of a metal plate from both sides by etching only, the metal plate cannot be penetrated with a gap width less than the plate thickness. With the present invention, however, since etching is progressed starting from the surface of the cut groove so as to sufficiently reach the interior of the metal plate, the amount to be etched in the direction of plate thickness is reduced and the amount corroded by the side etching is also reduced in comparison with those amounts resulting in the prior art. As a result, the width of the finally formed gap can be made equal to or less than the thickness of the metal plate, making it possible to process fine portions with a satisfactorily finished configuration and a high degree of dimensional accuracy.

Further, preferably, optical axes of laser beams are coaxially disposed on both sides of the metal plate, and the laser beams are simultaneously irradiated to the same position on both surfaces of the metal plate. With this feature, the laser beams are simultaneously irradiated to the same position on both surfaces of the metal plate and the cut grooves are formed in the same position on both surfaces of the metal plate. Consequently, the laser cutting can be performed in a shorter time, and the dimensional accuracy after the chemical corrosion can be improved.

In the present invention, preferably, prior to the laser cutting in the first step, a protective agent resistant to chemical corrosion is coated on the surface of the metal plate. With this feature, in the first step, the laser beam is irradiated to the metal plate from the surface of a layer of the protective agent resistant to chemical corrosion to form the cut grooves in the metal plate and, simultaneously, to remove the layer of the protective agent resistant to chemical corrosion in the irradiated areas to form openings. At this time, the openings formed in the layer of the protective agent resistant to chemical corrosion become a little larger than openings of the cut grooves under the effect of the heat produced by the laser beam. This means that when the cut grooves are completely formed by irradiation of the laser beam, a pattern corresponding to the final shapes of the gaps are formed in the layer of the protective agent resistant to chemical corrosion. Then, in the subsequent third step, chemical corrosion is effected in accordance with the pattern, while the portions of the metal plate surface which are coated with the protective agent resistant to chemical corrosion are protected against the chemical corrosion.

Also preferably, prior to the laser cutting in the first step, a protective agent for laser cutting is coated on the surface of the metal plate. This is effective to prevent the surface of the metal plate from being damaged with the heat produced by the laser beam, and hence to prevent drosses and sputters produced during the laser cutting from being directly deposited to the surface of the metal plate.

In the case of coating a protective agent resistant to chemical corrosion, preferably, a protective agent for laser cutting is further coated on the protective agent resistant to chemical corrosion. This arrangement is effective to prevent the layer of the protective agent resistant to chemical corrosion from being damaged with the heat produced by the laser cutting, and also prevent the layer of the protective agent resistant to chemical corrosion from being bored by drosses and sputters. This further prevents the drosses and the sputters from being deposited to the bored portions in the surface of the metal plate, and chemical corrosion from progressing through the holes. By using a protective film for laser cutting which is dissolved during the chemical corrosion, for example, the protective film can be easily removed at the same time. Even in the case of using a protective film for laser cutting which is not dissolved during the chemical corrosion, for example, the protective film can be removed by mechanically peeling it off or dissolving it with a solvent. After removing the protective film for laser cutting, the clean layer of the protective agent resistant to chemical corrosion is exposed so that the chemical corrosion is progressed in a sound condition.

In the present invention, preferably, after the laser cutting in the first step, a protective agent resistant to chemical corrosion is coated on the surface of the metal plate. By so coating, the protective agent resistant to chemical corrosion is entirely coated on the surface of the metal plate except the openings of the laser-cut grooves. Then, in the subsequent second step, the interiors of the cut grooves are sufficiently etched, while etching is also progressed to some extent in the direction of width of the cut grooves by the side etching, thereby chemically corroding the side walls of the cut grooves. Accordingly, the metal plate is etched such that even a portion a little larger than the openings of the cut grooves, i.e., a portion covered with the protective agent resistant to chemical corrosion, is corroded to some extent. Simultaneously, the joints are also etched so that the through holes in line are interconnected to finally define a gap. In this case, a layer of the protective agent resistant to chemical corrosion is prevented from damaging by irradiation of the laser beam, so that the coated portion is surely protected against the chemical corrosion and hence a satisfactory configuration can be realized. It is thus possible to produce gaps in a narrow width pattern.

Also, preferably, after the laser cutting in the first step, residual thermal strains caused by the laser cutting are removed. With this feature, even if thermal strains are caused in the metal plate by irradiation of the laser beam, a satisfactorily finished configuration and a high degree of dimensional accuracy can be realized by removing those thermal strains.

Affected layers are formed in the wall surfaces of the cut grooves due to the heat produced during the laser cutting. The affected layers contain substantial residual strains and residual stresses under the thermal effect, and are formed over entire wall surfaces of the cut grooves as well as of the joints. In the present invention, preferably, the thickness of the joint formed by the laser cutting in the first step is twice or more the thickness of affected layers formed in the wall surfaces of the cut grooves due to the heat produced during the laser cutting. With this feature, after the affected layers entirely formed in the wall surfaces of the cut grooves, including the joints, by the chemical corrosion in the second step are all eliminated, the joints are removed away. Stated otherwise, since the affected layers are all corroded to disappear before the joints are removed away, the metal plate is prevented from deforming due to residual strains and residual stresses. Conversely, if the thickness of the joints was less than twice that of the affected layers, the joints would be removed before the affected layers are eliminated. In this case, residual strains and residual stresses may be released from the affected layers left on the wall surfaces of the cut grooves, thereby causing a deformation of the metal plate.

The above metal plate processing method, preferably, comprises a first step of correcting a belt-shaped metal plate rolled into the form of a coil to be flat, a second step of carrying out laser cutting by irradiating a laser beam to said metal plate to form cut grooves such that a joint having a small thickness is left in part of wall surfaces of said cut grooves, a third step of coating a protective agent resistant to chemical corrosion on the surface of said metal plate before or after the laser cutting in said first step, a fourth step of chemically corroding the wall surfaces of said cut grooves to remove said joint to thereby form a gap, and a fifth step of removing said protective agent resistant to chemical corrosion on the surface of said metal plate and subjecting the exposed surface to cleaning and drying, whereby a number of metal plates each having said gaps are formed successively. With this feature, it is possible to permit mass production and hence to achieve a reduction in the cost.

Because the above processing method can finally process a metal plate into a satisfactorily finished configuration, it is suitable to form a lead frame having fine and highly accurate dimensions and configurations from a metal plate. According to the present invention, therefore, there is provided a lead frame processing method for forming, from a metal plate, a lead frame which has a number of inner leads connected to respective terminals of a semiconductor chip and outer leads extending outwardly of said inner leads in continuous relation, wherein at least said inner leads are formed by any of the above-described metal plate processing methods. In particular, it is preferable that at least the inner leads which comprise a number of pins and have a narrow pitch be formed by the metal plate processing method of the present invention.

Further, according to the present invention, there is provided a semiconductor device manufacturing method comprising a first step of correcting a belt-shaped metal plate rolled into the form of a coil to be flat, a second step of carrying out laser cutting by irradiating a laser beam to said metal plate to form cut grooves such that a joint having a small thickness is left in part of wall surfaces of said cut grooves, a third step of coating a protective agent resistant to chemical corrosion on the surface of said metal plate before or after the laser cutting in said first step, a fourth step of chemically corroding the wall surfaces of said cut grooves to remove said joint to thereby form a gap, a fifth step of removing said protective agent resistant to chemical corrosion on the surface of said metal plate and subjecting the exposed surface to cleaning and drying to thereby manufacture a number of lead frames each having said gaps successively, a sixth step of mounting semiconductor chips to said individual lead frames and electrically connecting terminals of each of said semiconductor chips to inner leads of the corresponding lead frame, a seventh step of integrally sealing off each assembly of said semiconductor chip and said inner leads individually by a resin molding, and an eighth step of severing said individual lead frames from each other to manufacture a number of semiconductor devices successively.

With the above method, mass production can be realized thoroughly from processing of the lead frames to manufacturing of the semiconductor devices, making it possible to manufacture a large number of semiconductor devices in a shorter time at the reduced cost.

Preferably, after at least one of said first to eighth steps is completed, the result of processing carried out in that step is inspected. With this feature, product quality can be controlled for each step.

BRIEF DESCRIPTION OF THE DRAWINGS

FIG. 1 is a perspective view showing a section of a metal plate formed according to a first embodiment of the present invention in which.

FIG. 7 is a sectional view showing the case where fine inner leads having a narrow width are formed by a conventional etching process in which.

FIG. 10 is a perspective view showing a section of a metal plate formed according to a fourth embodiment of the present invention in which.

DETAILED DESCRIPTION OF THE PREFERRED EMBODIMENT

Embodiments of a metal plate processing method, a lead frame processing method, a lead frame, a semiconductor device manufacturing method, and a semiconductor device according to the present invention will be hereinafter described with reference to the drawings.

First Embodiment

To begin with, a first embodiment of the present invention will be described with reference to FIGS. 1 to 7. In this embodiment, a metal plate is cut out in an appropriate pattern to form a lead frame.

Figure 2:
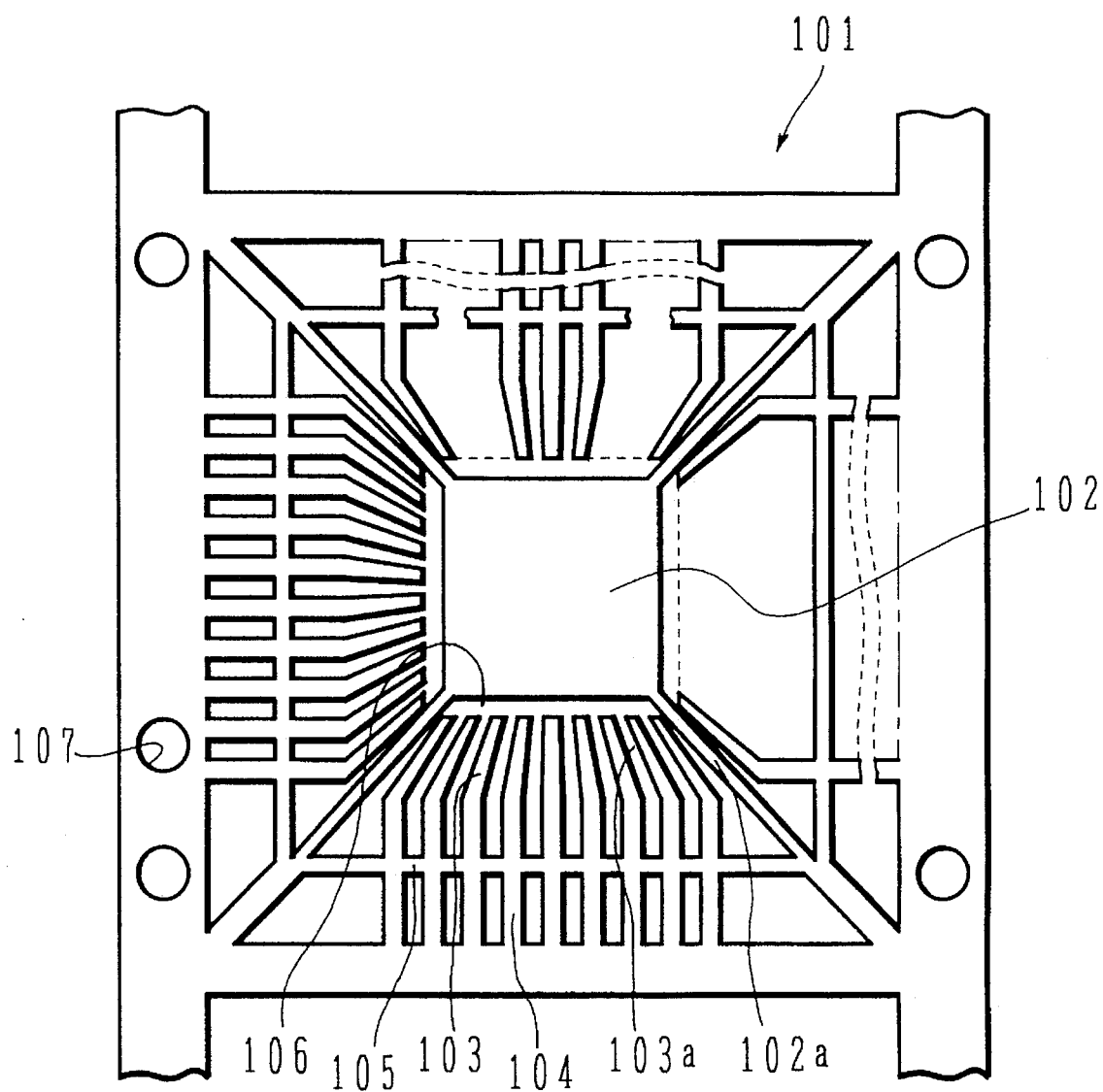
FIG. 2 is a view showing one example of a lead frame formed according to the first embodiment of the present invention.

First, FIG. 2 shows one example of a lead frame processed with this embodiment.

In FIG. 2, a metal plate 101 is provided in its central portion with a die pad 102 for mounting a semiconductor chip (not shown) thereon. A number of inner leads 103 and outer leads 104 extending in continuous relation to the inner leads 103 are disposed to surround the die pad 102. Pairs of the inner leads 103 and the outer leads 104 adjacent to each other are interconnected and supported by dam bars 105. Portions 106 around the die pad 102 except for arms 102a are penetrated through the plate. With the presence of the penetrated portions 106, the inner leads 103 are disconnected from the die pad 102 and every adjacent twos of the inner leads 103 are separated from each other. In an outer peripheral portion of the metal plate 101, there are defined positioning holes 107 for positioning the metal plate when terminals of the semiconductor chip are connected to the inner leads 103. The dam bars 105 serve to dam a resin flow when molding the semiconductor chip and also to reinforce the inner leads 103 and the outer leads 104, and are removed after the molding.

The inner leads 103 are extended in the form converging toward the die pad 102 as a whole, and their distal ends each have a width enough to establish electrical connection, such as wire bonding, after mounting a semiconductor chip (not shown) on the die pad 102. Accordingly, gaps 103a between the inner leads 103 are of a very fine structure such that the gap between every adjacent pairs of inner portions thereof, in particular, is narrower than the plate thickness. Further, processing of those inner portions is most demanding in terms of dimensional accuracy and cleaniness in processing the lead frame.

Figure 3:
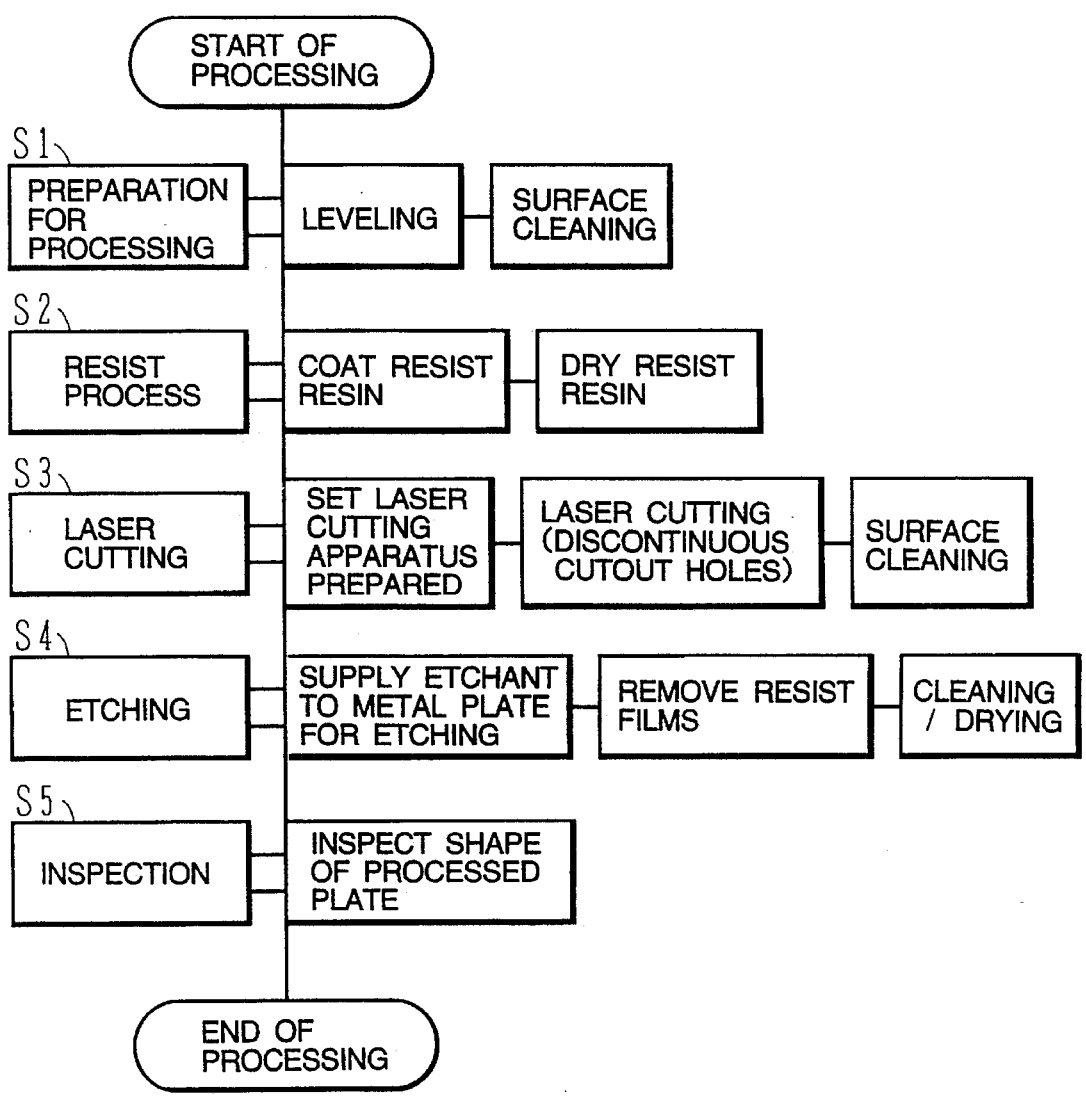
FIG. 3 is a flowchart for explaining processing steps of the lead frame formed according to the first embodiment of the present invention.

A description will now be made of manufacturing steps of the lead frame. FIG. 1 is a perspective view showing a section of a metal plate processed according to this embodiment, and FIG. 3 is a flowchart for explaining steps of processing the lead frame. Note that while the inner leads 103 (see FIG. 2) which have the narrowest pitch and the finest width in the lead frame are primarily processed in this embodiment, other portions than the inner leads 103 may be processed in a similar manner.

First, preparation for processing is made in step S1 of FIG. 3. More specifically, a belt-shaped metal plate rolled into the form of a coil and made of, e.g., steel, copper alloy, 42 Alloy or Kovar is leveled by being passed through a leveler to eliminate a tendency of the plate to curve. Subsequently, the surfaces of the metal plate are cleaned to remove dirt, oil and so on. By thus employing a belt-shaped metal plate rolled into the form of a coil as a material, a number of lead frames can be continuously processed while unrolling the coiled metal plate.

Next, a resist process is carried out in step S2. More specifically, as shown in the perspective view of FIG. 1A, a resist resin is coated on both surfaces of the metal plate 101 and dried to cover both the surfaces of the metal plate 101 with resist films 1. When a generally known resist resin is used in this embodiment, any other suitable protective agent resistant to chemical corrosion, for example, oil and fats, a synthetic resin solution such as styrene or nylon, and liquid glass may be coated (this will also be equally applied to second to fifth embodiments described later).

Then, laser cutting is carried out in step S3. A laser cutting apparatus used in this step for generating a laser beam may be of a conventional type generally known in the art. One example of an optical system of the laser cutting apparatus is shown in FIG. 4.

Figure 4:
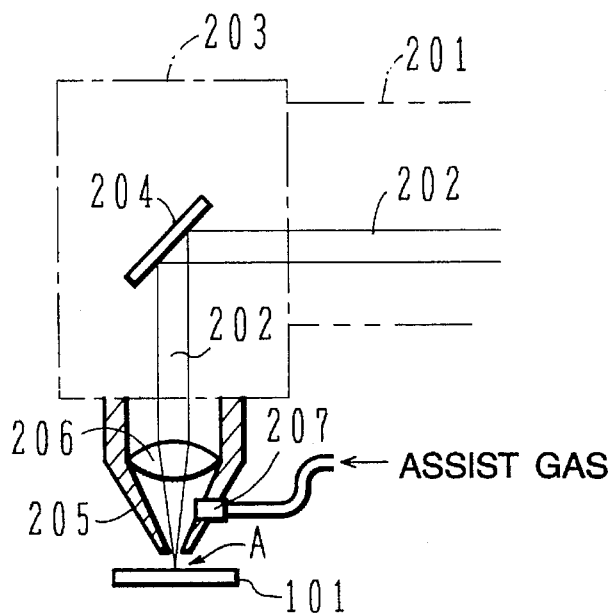
FIG. 4 is a view showing one example of an optical system of a laser cutting apparatus used in step S3 of FIG. 3.

In FIG. 4, a laser beam 202 emitted from a laser oscillator 201 enters a bending mirror 204 in a working head 203 and is guided in a direction toward the metal plate 101. The laser beam 202 then enters a condensing lens 206 disposed in a nozzle 205, by which it is condensed to such an extent as enough to provide an energy density required to enable laser cutting. The condensed laser beam is irradiated from a distal end of the nozzle 205 to the metal plate 101 at a position A to be cut. Further, the nozzle 205 is provided with an assist gas supply port 207 so that an assist gas is ejected from the distal end of the nozzle in surrounding and coaxial relation to the laser beam 202.

In step S3 of FIG. 3, the laser cutting apparatus constructed as above is first prepared by setting various conditions such as the oscillation period and the energy density of the laser beam 202, the focus position of the condensing lens 206, the pressure of the assist gas, and the position to be cut.

Figure 5:
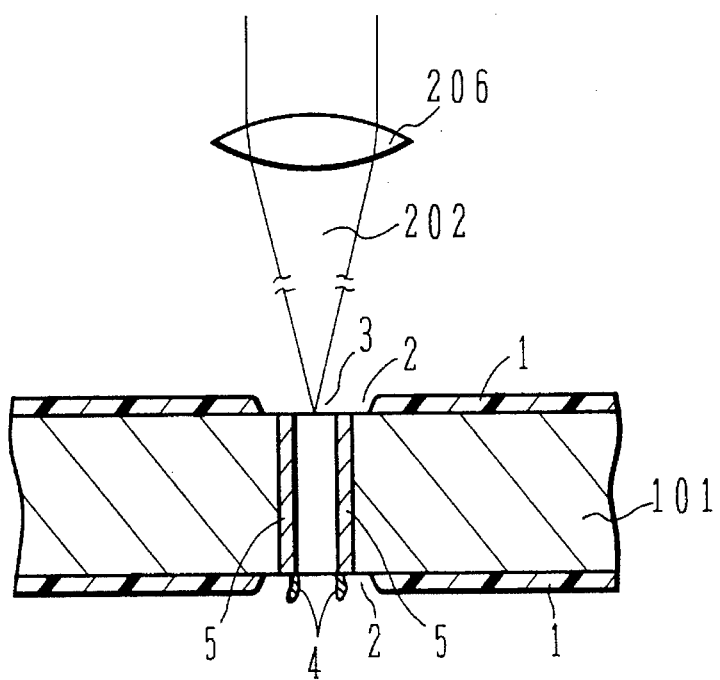
FIG. 5 is a conceptual view showing a section of the metal plate cut through by the laser cutting apparatus having the optical system shown in FIG. 4.

Subsequently, the metal plate 101 is laser-cut by the laser cutting apparatus. FIG. 5 is a conceptual view showing a section of the metal plate subject to laser cutting at this time. In FIG. 5, the laser beam 202 is condensed by the condensing lens 206 to be able to supply a sufficient amount of thermal energy. A portion of the surface of the metal plate 101 irradiated by the laser beam is molten and serves as a heat source such that the molten portion is progressed gradually from the plate surface in a direction of depth and the metal plate 101 is eventually penetrated to form a through hole 3 (cut groove). Since the laser beam 202 can be condensed to a very small diameter, the through hole 3 can have a very narrow width.

The resist films 1 are also cut with heat produced under irradiation of a laser beam. More specifically, the resist film 1 on the front surface is first cut by the laser beam 202 to form an opening 2 on the front side. Then, after the through hole 3 has been penetrated, the resist film 1 on the rear surface is cut to form an opening 2 on the rear side. The openings 2 on the front and rear sides have sizes substantially equal to each other but a little larger than that of the through hole 3 as shown.

Most of the molten metal produced with the irradiation of the laser beam is fallen down from the rear surface of the metal plate 101, but a part of the molten metal remains and is solidified there to become drosses 4. The drosses 4 are specific to laser cutting as one kind of thermal process, and are responsible for a degradation in dimensional accuracy and a short circuit between leads. Further, the thermal effect upon the irradiation of the laser beam 202 changes properties of the material of metal plate 101 to form affected layers 5. Residual strains and residual stresses produced in the affected layers 5 may cause deformations of the plate. Additionally, an oxide coating (not shown) is formed on the surface of a portion and thereabout of the metal plate 101 to which the laser beam 202 is irradiated because that portion is heated up to high temperature, which may cause a contact failure when terminals are electrically connected. The drosses 4, the affected layers 5 and the oxide coating are, however, all removed by etching as described later.

Figure 6A:
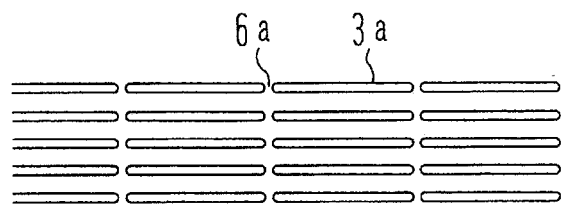
FIGS. 6A–6D are views showing examples of through holes formed by laser cutting in step S3 of FIG. 3.
Figure 6B:
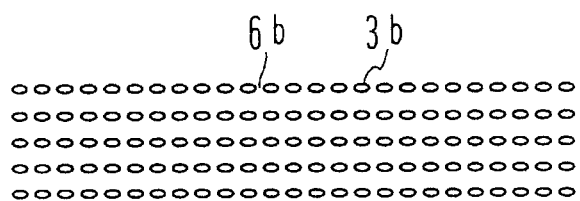
Figure 6C:
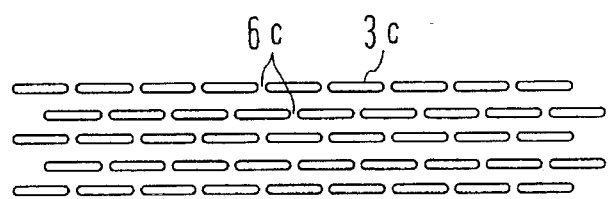
Figure 6D:
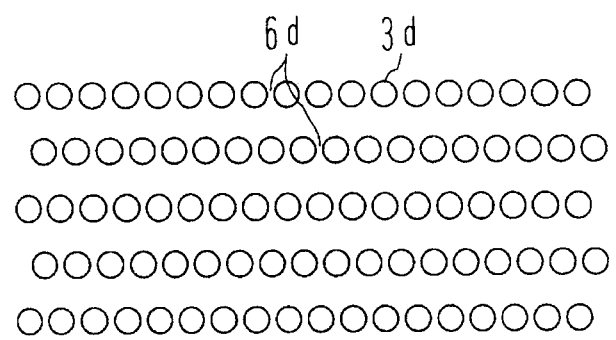

By moving the metal plate 101 or the position irradiated by the laser beam 202 under the above condition, a multiplicity of through holes 3 are formed in discontinuous relation with a joint 6 left between the adjacent through holes 3. Examples of discontinuous arrangements of the through holes 3 are shown in FIGS. 6A to 6D. FIG. 6A shows an arrangement in which elongate through holes 3a having the same length are regularly aligned in line side by side with joints 6a left between the adjacent through holes 3a in each line. The through holes 3 and the joints in FIG. 1 are formed in this manner. FIG. 6B shows an arrangement in which a number of short through holes 3b are aligned in line side by side With joints 6b left between the adjacent through holes 3b in each line. FIG. 6C shows an arrangement in which elongate through holes 3c having the same length are aligned in line side by side with joints 6c left between the adjacent through holes 3c in each line, and the through holes 3c in adjacent lines are relatively offset from each other. FIG. 6D shows an arrangement in which circular through holes 3d are aligned in line side by side with joints 6d left between the adjacent through holes 3d in each line, and the through holes 3d in adjacent lines are relatively offset from each other. The lines defined by the multiplicity of through holes formed as shown in any of FIGS. 6A to 6D correspond to the configuration of the lead frame shown in FIG. 2, and the discontinuous through holes in line are joined with each other when the joints between the through holes are removed by etching in a later-described step.

Figure 1A:
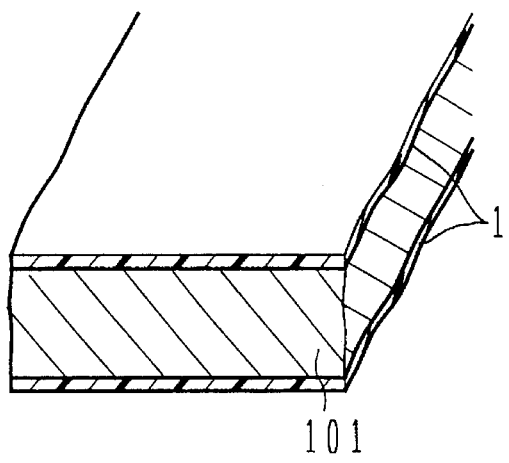
FIG. 1A shows a condition where a resist film is coated over both surfaces of a metal plate.
Figure 1B:
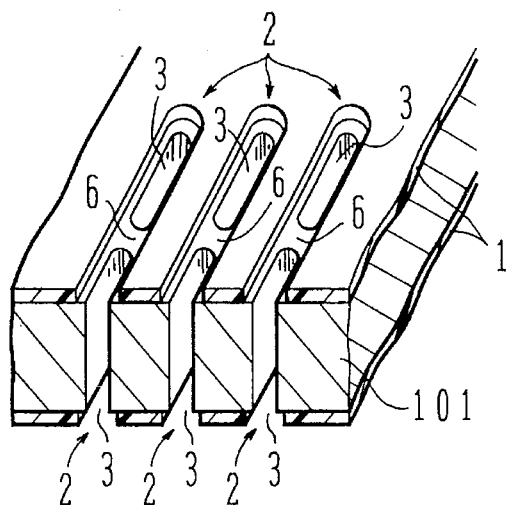
FIG. 1B shows a condition where through holes are formed in the metal plate by laser cutting.

Since the size of the openings 2 in the resist films 1 is a little larger than that of the through holes 3 as described above, the openings 2 in the resist films 1 are substantially joined with each other, as shown in FIG. 1B, at the time the line of through holes 3 is formed. The joints 6 between the adjacent through holes 3 in each line are not covered with the resist films 1 so that the joints 6 may be removed by etching in a later-described step to make the through holes 3 continuous in line. In other words, the openings 2 in the resist films 1, which are joined with each other at the time the line of through holes 3 is formed, serve as an etching pattern. After the completion of the laser cutting described above, the surfaces of the metal plate 101 are cleaned as shown in FIG. 3.

Note that the above-described laser cutting is applied to at least the inner leads 103 shown in FIG. 2, i.e., the portions of the lead frame which have a narrow pitch and demand a strict degree of dimensional accuracy and cleaniness. The other portions in a relatively large pattern may be formed by a conventional etching or punching process.

In this embodiment, the laser cutting is not required to form the workpiece into the final desired configuration by using the laser beam 202, but performs its role sufficiently if the workpiece is laser-cut into the discontinuous broken-line form as shown in FIG. 6. As compared with the prior art in which the final desired configuration is formed by using a laser beam only, therefore, the amount to be cut by the laser beam can be reduced. It is thus possible to make very small the area suffering the effect of the heat produced by the laser beam, and to reduce resultant thermal deformations.

Also, the prior art processing method of forming the final desired configuration by using a laser beam only is disadvantageous in that a thermal deformation caused by irradiation of the laser beam may affect a next laser cutting step such that thermal deformations are accumulatively increased to eventually cause a substantial error in dimension. In contrast, such a disadvantage can be eliminated in the present invention.

Furthermore, since the multiplicity of through holes 3 are discontinuously present in line during the processing, the presence of the joints 6 between the adjacent through holes keeps the metal plate 101 in a highly rigid state, allowing the metal plate 101 to be easily handled. This condition also prevents deformations and manufacturing errors occurred during the processing. Thus, since the metal plate 101 has a high degree of rigidity and can be easily handled, for example, the process of mechanically removing drosses and sputters produced incidental to the laser cutting, or the post-process after the laser cutting, such as cleaning of the metal plate 101, is simplified.

Figure 1C:
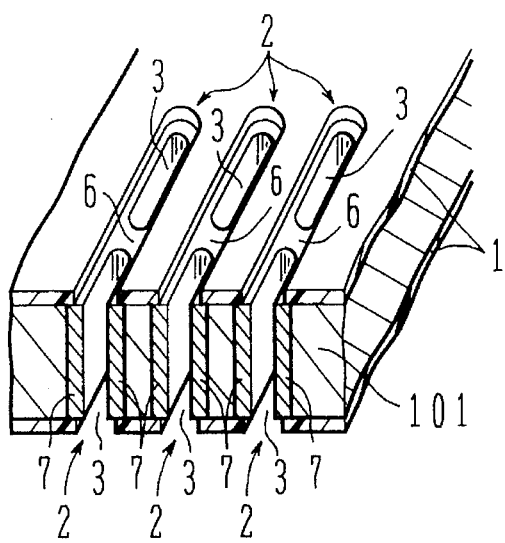
FIG. 1C shows etched portions which are to be removed by etching.

Then, etching is carried out in step S4 of FIG. 3. FIG. 1C is a view for explaining the etching step. Note that the drosses 4 and the affected layers 5 (see FIG. 5) are omitted in FIG. 1 for the sake of simplicity. While this embodiment employs a general wet etching method with which a metal plate is immersed in an etchant, or an etchant is sprayed to a metal plate, other chemical etching methods, e.g., an electrolytic etching method with which a current is passed through an etchant with a metal plate immersed in the etchant, and a dry etching method with which a metal plate is exposed to a chemically corrosive gas, may be employed instead (this will also be equally applied to second to fifth embodiments described later).

When an etchant is supplied to the metal plate 101, the interior of each through hole 3 is also sufficiently supplied with the etchant, and side walls 7, shown in FIG. 1C, defining the through hole 3 are etched substantially evenly in the direction of plate thickness. As a result, the metal plate 101 is etched such that even a portion covered with the resist films 1 is corroded to some extent and a portion a little larger than the openings 2 is removed. Further, since the etching is an isotropic process, the joints 6 shown in FIG. 1C are also etched. In other words, the through holes 3 are extended.

As a consequence, the joints 6 are removed and the through holes 3 in each line are interconnected to finally define gaps 103a (see FIG. 2) in a desired configuration, thereby forming the inner leads 103. At this time, the drosses 4 deposited to the metal plate 101 and the affected layers 5 and oxide coatings both formed on the metal plate 101 are also removed by the etchant so that the inner leads 103 have smooth and clear sectioned surfaces being of a rectangular shape. The portions of the metal plate which are sufficiently far from the through holes 3 and the openings 2 in the resist films 1 are not affected by the etching.

Figure 7A:
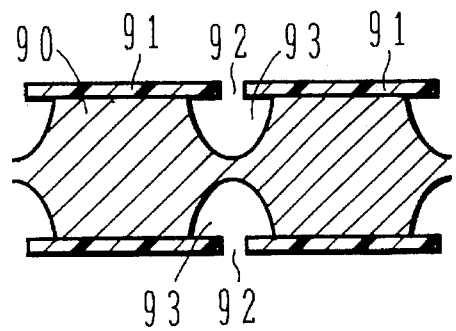
FIG. 7A shows a condition in the course of etching.
Figure 7B:
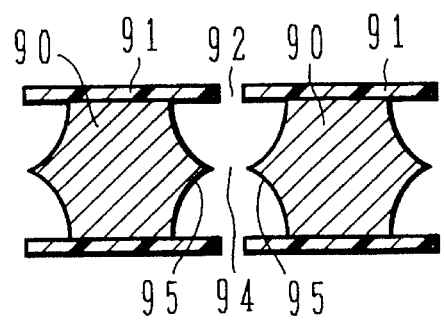
FIG. 7B shows a condition where etched portions are grown from both sides of a metal plate and joined with each other at the middle of the metal plate with progress of the etching.
Figure 7C:
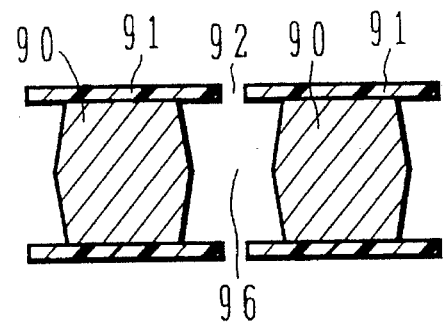
FIG. 7C shows a finished shape in which projections present in FIG. 7B at the middle in the direction of plate thickness are eliminated.

Meanwhile, there has hitherto been a problem that a process using etching only has a limit in processing and, particularly when processing fine portions of a metal plate from both sides by etching only, the metal plate cannot be penetrated with a gap width less than the plate thickness. FIG. 7 is a sectional view for explaining the problem, the view showing a condition where etching is progressed from both sides of a metal plate. In FIG. 7, etching is started from fine openings 92 in resist films 91. Since etching is an isotropic process, the etching is progressed from both sides of the metal plate 90 through equal distances and, as shown in FIG. 7A, portions 93 corroded by the etching each have the recessed form defined by a curved surface in an intermediate stage. With the further progress of the etching, the etching corroded portions 93 meet each other at the middle of the metal plate 90 and, as shown in FIG. 7B, an etched opening 94 penetrating the metal plate 90 is formed. At this time, the metal plate is etched not only in the direction of plate thickness, but also in the direction of plate plane to the same extent by side etching. Projections 95 remain at the middle of the metal plate 90 in the direction of plate thickness, but these projections 95 are removed in a short time with the further progress of the etching, as shown in FIG. 7C. Finally, a gap 96 is formed.

With the conventional etching, as described above, because side etching is progressed to the same extent as in the direction of plate thickness, the final gap 96 has a width larger than the thickness of the metal plate 90. This means that When a metal plate is finely processed from both sides, it has been impossible to penetrate the metal plate with a gap width less than the plate thickness by etching only.

In contrast, the above problem is solved by this embodiment as follows. The width of the joints 6 between the adjacent through holes 3 is selected to be smaller than the thickness of the metal plate 101. By so selecting, before the metal plate is etched away in the direction of width of each through hole 3 by an amount of about half the plate thickness on each side of the hole, i.e., about the plate thickness on both sides, the etching is also progressed in the direction of line (or the lengthwise direction) of the through holes 3 to such an extent that the joints 6 between the adjacent through holes 3 are removed. In other words, at the time the through holes 3 in line are finally joined with each other, the amount by which the metal plate 101 has been etched in the direction of width of each through hole 3 can be smaller than the thickness of the metal plate 101. The width of the gap 103*a* to be finally processed is given by the sum of the width of the through hole 3 having already been formed by the laser cutting and the size by which the metal plate is etched in the direction of width of the through hole 3. However, since the laser beam 202 can be condensed into a very small diameter, the width of the gap 103*a* in the finished configuration can be made substantially equal to or less than the thickness of the metal plate 101. This makes it possible to form a gap having a narrower width than the processing limit in the prior art.

The affected layers 5 contain substantial residual strains and residual stresses as a result of being thermally affected during the laser cutting, and are formed over entire surfaces of the side walls 7 of the through holes 3 (cut grooves) as well as of the joints 6. In the case of a metal plate of 42 Alloy being 0.15 mm thick, for example, a affected layer thus formed has a thickness of about 5 to 25 µm. It is thought that a affected layer having a thickness in the similar range is also formed when using a metal plate of 18-8 stainless or the like.

In this embodiment, the thickness of the joints 6 formed by the laser cutting in step S3 is selected to be twice or more that of the affected layers 5 formed under the thermal effect of the laser beam 202. The conditions meeting the above relationship may be determined beforehand by trial experiments. By so selecting, after the side walls 7 of the through holes 3 are dissolved from both ends of each of the joints 6 by the etching in step S4 and the affected layers 5 are then all eliminated, the joints 6 are removed away. Stated otherwise, since the affected layers 5 are all corroded to disappear before the joints 6 are removed away, the metal plate 101 is prevented from deforming due to residual strains and residual stresses. Conversely, if the thickness of the joints 6 was less than twice that of the affected layers 5, the joints 6 would be removed before the affected layers 5 are eliminated. In this case, residual strains and residual stresses may be released from the affected layers 5 left on the side walls 7 of the through hole 3, thereby causing a deformation of the metal plate 101.

Figure 1D:
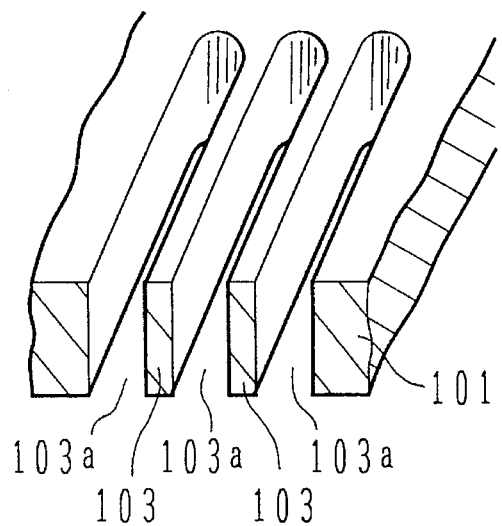
FIG. 1D shows a condition where gaps are formed by etching and the resist films are removed.

After the completion of the above etching step, the resist films 1 are removed. The condition resulted at this time is shown in FIG. 1D. Subsequently, the metal plate 101 is subject to cleaning and drying to remove the drosses, the oxides and so on which have not been fully removed by the etching, thereby completing the processing of the metal plate 101. Since the etching is a non-thermal process, the metal plate 101 can realize a satisfactory smooth processed configuration and a high degree of dimensional accuracy after the processing without causing any thermal deformations.

Finally, the configuration of the metal plate processed as described above, i.e., of the lead frame, is inspected in step S5.

With this embodiment described above, since the through holes 3 are formed by irradiation of a laser beam discontinuously into a line, e.g., in the broken-line form, while leaving the joints 6 between the adjacent through holes, the amount to be cut by the laser beam can be reduced and the area suffering the effect of the heat produced by the laser beam can be made very small so as to reduce resultant thermal deformations, in comparison with the prior art in which a metal plate is formed into the final desired configuration by using a laser beam only. Also, unlike the case of forming a metal plate into the final desired configuration by using a laser beam only, thermal deformations will not be accumulatively increased to eventually cause a substantial error in dimension. Further, since the multiplicity of through holes 3 are discontinuously present in line during the processing, the presence of the joints 6 between the adjacent through holes 3 keeps the metal plate 101 in a highly rigid state, allowing the metal plate to be easily handled. This is also effective to prevent deformations and manufacturing errors occurred during the processing.

Since etching (chemical corrosion) as a non-thermal process is finally carried out, the thermal effect is not produced and the drosses 4, the affected layers 5, the oxide coatings, etc. are removed. In addition, the finally remained portions have a satisfactory processed configuration and the dimensional accuracy is improved. In other words, rather than laser cutting and etching being used to respective separate portions as in the prior art, laser cutting and etching are combined with each other to positively utilize features of both the processing methods, making it possible to improve the dimensional accuracy. Furthermore, no post-process which may impair the dimensional accuracy after the processing is required and hence a condition of good dimensional accuracy can be maintained.

By selecting the width of the joints 6 between the adjacent through holes 3 in line to be smaller than the thickness of the metal plate 101, at the time the through holes 3 in line are joined with each other, the amount by which the metal plate 101 has been etched in the direction of width of each through hole 3 can be made smaller than the thickness of the metal plate 101. Additionally, since the laser beam 202 used for forming the through holes 3 can be condensed into a very small diameter, the width of the gap 103*a* in the finished configuration can be made substantially equal to or less than the thickness of the metal plate. As a result, a gap having a narrower width than the processing limit in the prior art can be formed.

Since the thickness of the joints 6 formed by the laser cutting is selected to be twice or more that of the affected layers 5 formed under the thermal effect of the laser beam 202, the affected layers 5 are all corroded to disappear before the joints 6 are completely removed by the etching. Therefore, the metal plate 101 is prevented from deforming due to residual strains and residual stresses after the processing.

By applying this embodiment to processing of at least the inner leads 103 of the lead frame which have a narrow pitch and demand a strict degree of dimensional accuracy and cleanness, the advantage of this embodiment can be maximally utilized.

Moreover, since a belt-shaped metal plate rolled into the form of a coil can be employed as a material, a number of lead frames can be continuously processed while unrolling the coiled metal plate. In addition to the above-described advantages, the continuous processing is able to achieve mass production and hence a reduction in the cost by continuously processing a number of lead frames.

Second Embodiment

A second embodiment of the present invention will be described below with reference to FIG. 8. In this embodiment, too, a metal plate is cut out in an appropriate pattern to form a lead frame.

Figure 8:
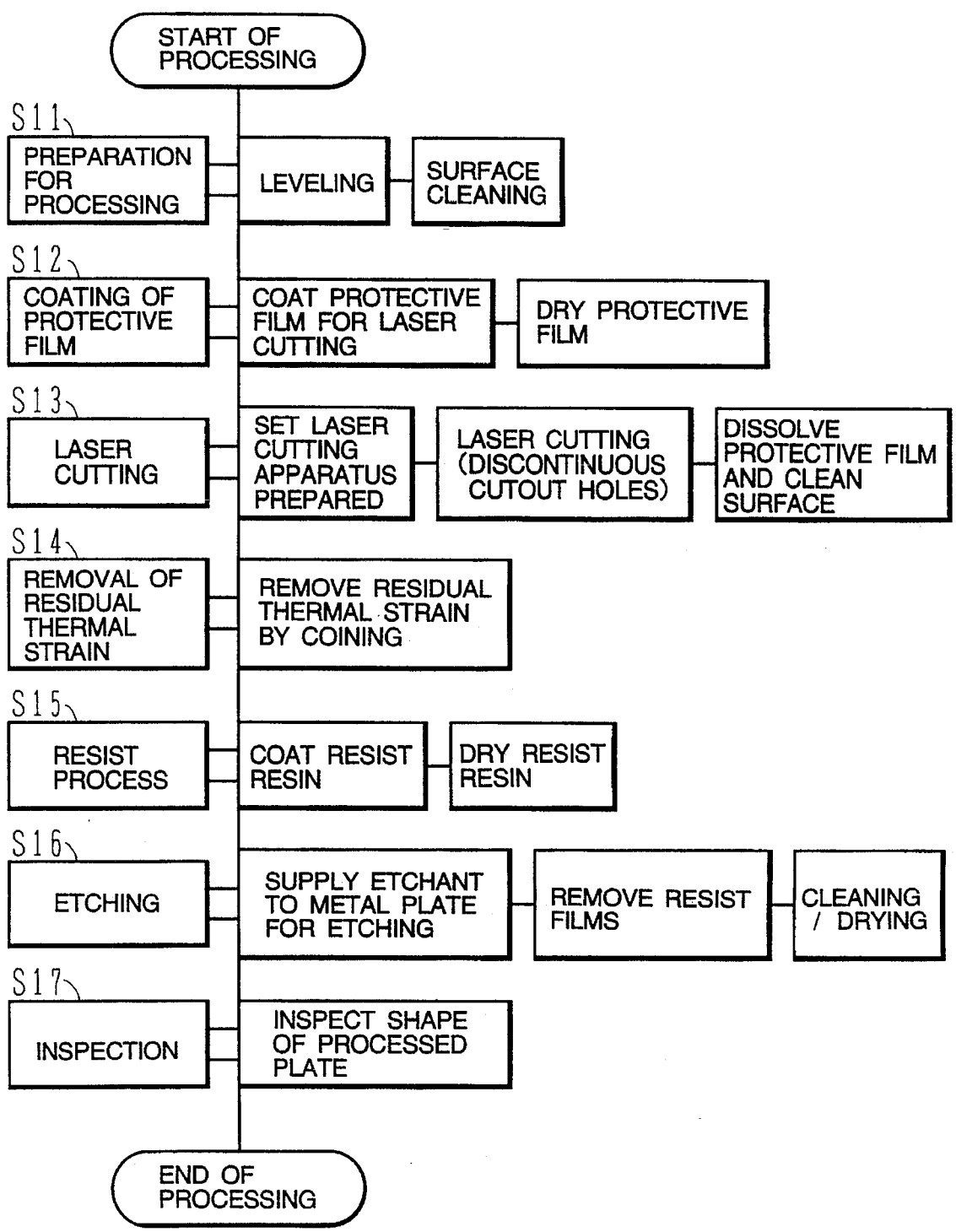
FIG. 8 is a flowchart, in which a second embodiment of the present invention is shown, for explaining processing steps of a lead frame.

First, preparation for processing is made in step S11 of FIG. 8. More specifically, a belt-shaped metal plate rolled into the form of a coil is leveled by being passed through a leveler to eliminate a tendency of the plate to curve. Subsequently, the surfaces of the metal plate are cleaned to remove dirt, oil and so on. Also in this embodiment, by employing a belt-shaped metal plate rolled into the form of a coil as a material, a number of lead frames can be continuously processed while unrolling the coiled metal plate. Then, a protective agent for laser cutting is coated and dried in step S12. While the protective agent for laser cutting used in this embodiment comprises a resin which is easily dissolved with a solvent and made of a different material from that of a resist film, it may comprise, for example, carbon powder mixed with an adhesive or the like as with a fourth embodiment described later, or a metal or the like plated over the resist film.

Next, laser cutting is carried out in step S13 in a similar manner as shown in FIG. 5. More specifically, a laser cutting apparatus is first made prepared by setting various conditions for the laser cutting. After that, through holes are formed in the metal plate by irradiating a laser beam. At this time, the protective film for laser cutting coated in step 12 serves to prevent the surface of the metal plate being damaged and to avoid drosses and sputters produced during the laser cutting from being directly deposited to the surface of the metal plate. Also, like the arrangements shown in FIG. 6, a multiplicity of through holes are discontinuously formed in line side by side. Thereafter, the protective film for laser cutting is dissolved with a solvent and the metal plate is subject to surface cleaning. This surface cleaning may be performed by the solvent that is used to dissolve the protective film for laser cutting.

Then, residual thermal strains are removed in step S14. In the laser cutting of step S13, since the through holes are discontinuously formed in line side by side, thermal strains and thermal deformations are less likely to occur in the processed portions. However, because of the metal plate being subject to thermal hysteresis of local quick-heating and quick-cooling, thermal strains and small thermal deformations are inevitably produced due to, e.g., affected layers formed near the surfaces of the metal plate, and they remain in most cases. In this step S14, residual thermal strains are removed by carrying out a coining process in which a compressive stress is applied to the metal plate in the direction of plate thickness after being subject to the laser cutting in step S13. As a result, a satisfactory processed configuration and a high degree of dimensional accuracy can be realized. Other than the coining, residual thermal strains may be removed by, for example, skin pass rolling or heat treatment.

Next, a resist process is carried out in step S15. More specifically, a resist resin is coated on both surfaces of the metal plate by using a roller or the like and dried to cover both the surfaces of the metal plate with resist films. At this time, since the resist resin is coated by using a roller or the like, surface openings defined by the through holes laser-cut in step S13 are not covered with the resist film.

Next, etching is carried out in step S16 as with step S4 of FIG. 3. In this etching step, an etchant is sufficiently supplied to the interior of each through hole as well, and the etching is also progressed in the direction of width of the through hole by side etching so as to etch side walls of through hole. As a result, the metal plate is etched such that even a portion a little larger than the through hole, i.e., a portion covered with the resist films, is corroded to some extent. Simultaneously, the joints between the adjacent through holes 3 in line are also removed by the etching so that the through holes in line are interconnected to finally define a gap of a desired shape. At this time, the drosses, the affected layers and the oxide coatings are removed by the etchant.

After that, the resist films are removed and the metal plate is cleaned and dried. As with the foregoing embodiment, the remaining portions of the metal plate, i.e., the inner leads, have sectioned surfaces being of a smooth and satisfactory configuration in this embodiment.

Finally, the configuration of the metal plate processed as described above, i.e., of the lead frame, is inspected in step S17.

With this embodiment described above, the following advantages are obtained in addition to similar advantages as obtained in the above embodiment. Since the protective agent for laser cutting is coated, the surface of the metal plate is prevented from being damaged, and drosses and sputters are avoid from being directly deposited to the surface of the metal plate. Further, since residual thermal strains are removed by coining, a satisfactory processed configuration and a high degree of dimensional accuracy can be realized.

Additionally, since the metal plate can be kept in a highly rigid state as with the foregoing embodiment, the subsequent such steps as removing the protective agent for laser cutting, removing residual thermal strains, and coating the resist films for etching can be easily performed in a short time without any deformations of the metal plate.

Third Embodiment

A third embodiment of the present invention will be described below with reference to FIGS. 2 and 9. In this embodiment, too, a metal plate is cut out in an appropriate pattern to form a lead frame.

Figure 9:
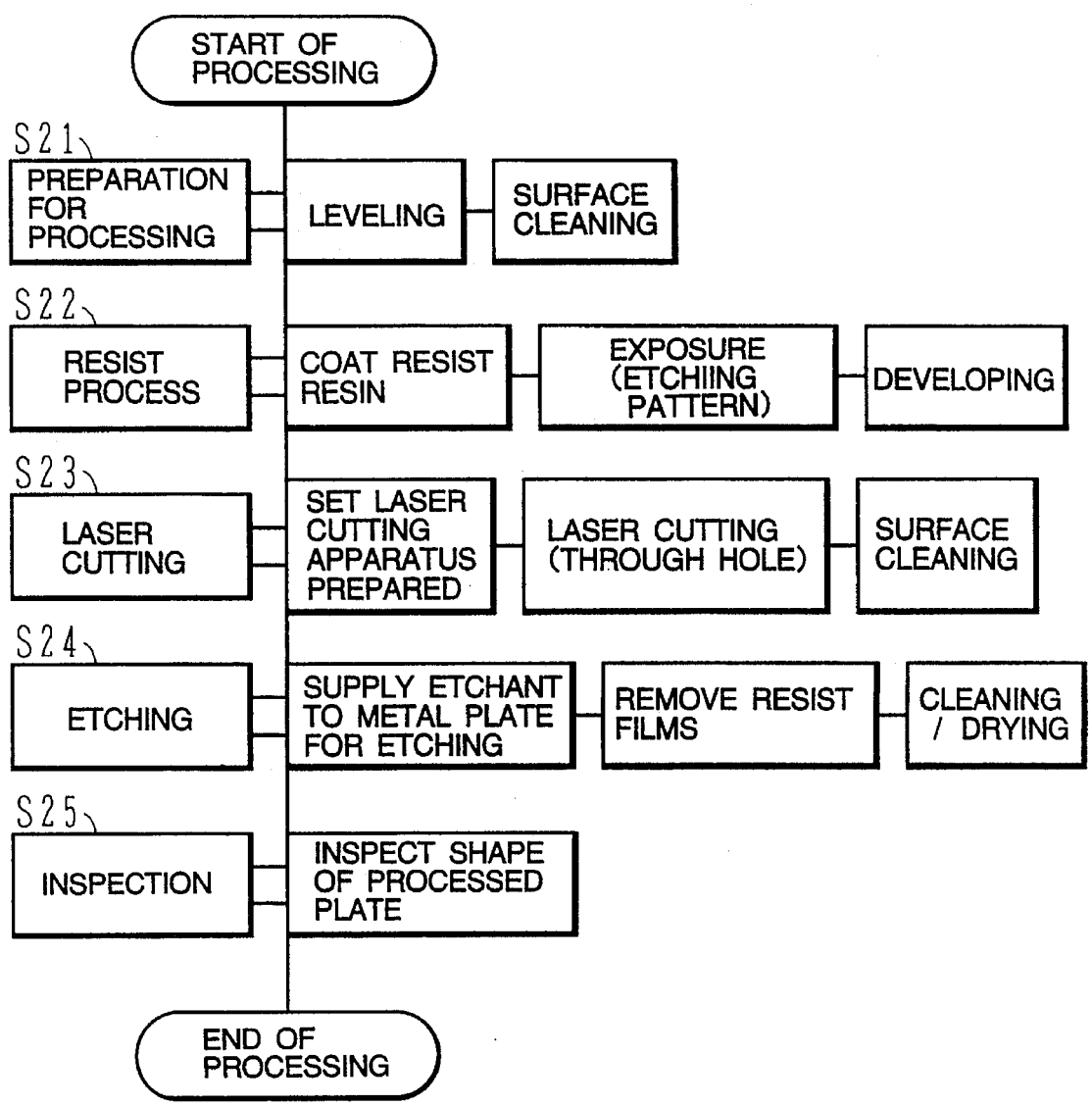
FIG. 9 is a flowchart, in which a third embodiment of the present invention is shown, for explaining processing steps of a lead frame.

First, preparation for processing is made in step S21 of FIG. 9. More specifically, a belt-shaped metal plate rolled into the form of a coil is leveled by being passed through a leveler to eliminate a tendency of the plate to curve. Subsequently, the surfaces of the metal plate are cleaned to remove dirt, oil and so on. Also in this embodiment, by employing a belt-shaped metal plate rolled into the form of a coil as a material, a number of lead frames can be continuously processed while unrolling the coiled metal plate.

Then, a resist process is carried out in step S22. More specifically, a photosensitive agent is coated on both surfaces of the metal plate and dried to entirely cover both the surfaces with resist films. An original plate (not shown) having a desired etching pattern is laid over each surface of the metal plate, which is then subject to exposure for transferring the etching pattern to the plate surface. The metal plate having been subject to exposure is immersed in a developer for developing the etching pattern due to a difference in dissolution caused by the exposure. The desired etching pattern in accordance with the configuration of a lead frame is thus formed on the resist pattern. The etching pattern formed by the above resist process corresponds to portions in a relatively large pattern such as the outer leads 104 and the positioning holes 107 other than the inner leads 103 shown in FIG. 2. In this stage, the portions corresponding to the inner leads 103 are fully covered with the resist films 1.

Next, laser cutting is carried out in step S23 in a similar manner as shown in FIG. 5. Note that the laser cutting is applied to the portions corresponding to the inner leads 103 in FIG. 2 where the etching pattern is not formed in step S22, i.e., the portions of the lead frame which have a narrow pitch and demand a strict degree of dimensional accuracy and cleanness. A laser cutting apparatus is first made prepared by setting various conditions for the laser cutting. After that, through holes are formed in the metal plate by irradiating a laser beam. Like the arrangements shown in FIG. 6, a multiplicity of through holes are discontinuously formed in line side by side. At the time the lines of through holes are formed, openings in the resist film formed by the laser cutting are substantially joined with each other to serve as an etching pattern corresponding to the inner leads 103 in the next step. After the completion of the laser cutting described above, the surfaces of the metal plate are cleaned.

Next, etching is carried out in step S24 as with step S4 of FIG. 3. At this time, in the portions corresponding to the inner leads 103, an etchant is sufficiently supplied to the interior of each through hole as well, and side walls defining the through hole are etched substantially evenly in the direction of plate thickness. As a result, the metal plate is etched such that a portion a little larger than the openings in the resist films is removed to some extent and, simultaneously, the joints between the adjacent through holes are etched, whereby the through holes are extended. Consequently, the joints are removed and the through holes are interconnected for each line so as to finally define gaps in a desired configuration. At this time, the drosses, the affected layers and the oxide coatings are also removed by the etchant.

Further, in this etching step, the portions corresponding to the etching pattern formed in step S22 are also etched to form the outer leads 104, the positioning holes 107, etc. Thus, the relatively large portions are not preliminarily cut by the laser beam, but processed by only etching which is more efficient than laser cutting. Accordingly, the relatively large portions can be processed with higher efficiency, and the laser cutting that requires a longer time is applied to only the fine portions such as the inner leads 103 to reduce the amount to be laser-cut, making it possible to shorten the processing time. The relatively large portions such as the outer leads 104 and the positioning holes 107 may be formed by conventional punching rather than being formed by etching as described above.

After that, the resist films are removed and the metal plate is cleaned and dried. As with the foregoing embodiments, the remaining portions of the metal plate, i.e., the inner leads, have sectioned surfaces being of a smooth and satisfactory configuration in this embodiment.

Finally, the configuration of the metal plate processed as described above, i.e., of the lead frame, is inspected in step S25.

With this embodiment described above, the following advantages are obtained in addition to similar advantages as obtained in the above embodiment. Since the relatively large portions such as the outer leads 104 and the positioning holes 107 are not laser-cut, but etched at the same time as etching the through holes formed corresponding to the inner leads 103, the lead frame is processed efficiently. The laser cutting that requires a relatively long time is applied to only the fine portions such as the inner leads 103 to reduce the amount to be laser-cut. As a result, the processing time can be shortened.

Fourth Embodiment

A fourth embodiment of the present invention will be described below with reference to FIGS. 10 to 14. In this embodiment, too, a metal plate is cut out in an appropriate pattern to form a lead frame.

Figure 10A:
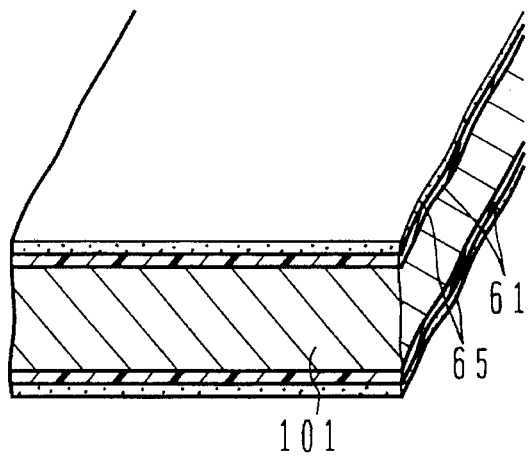
FIG. 10A shows a condition where a resist film and a laser cutting protective film are coated over both surfaces of a metal plate.
Figure 10B:
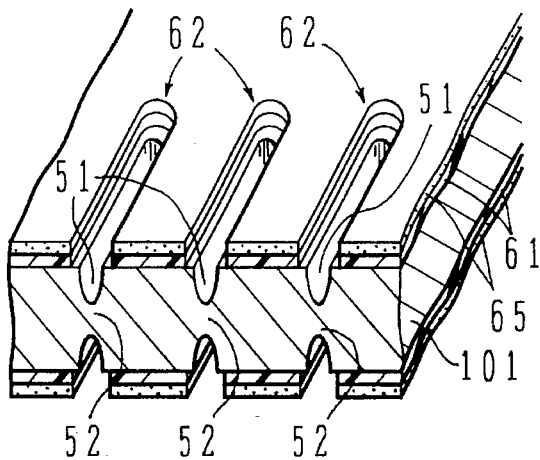
FIG. 10B shows a condition where grooves are formed in the metal plate by laser cutting.
Figure 10C:
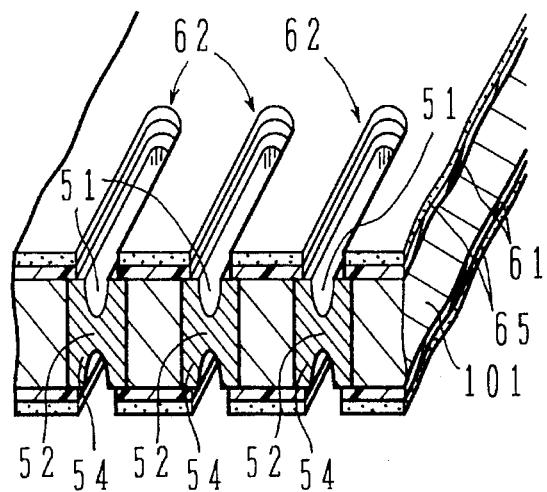
FIG. 10C shows etched portions which are to be removed by etching.
Figure 10D:
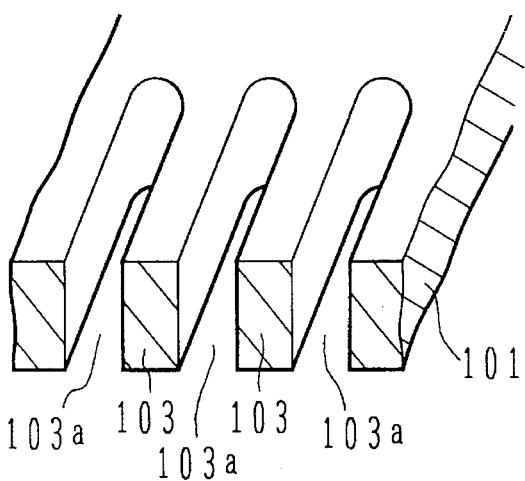
FIG. 10D shows a condition where gaps are formed by etching and the resist films are removed.
Figure 11:
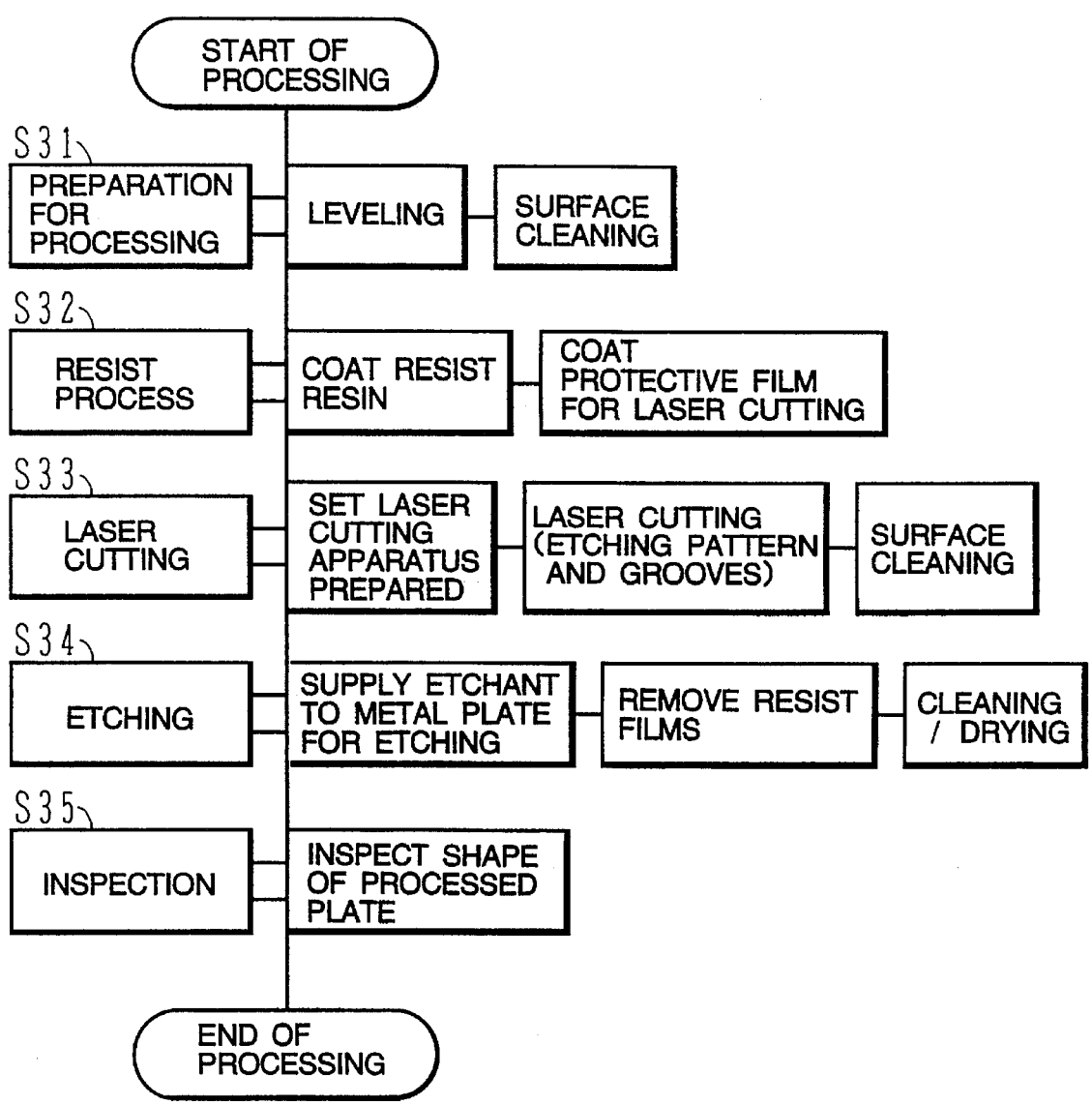
FIG. 11 is a flowchart for explaining processing steps of a lead frame formed according to the fourth embodiment of the present invention.

FIG. 10 is a perspective view showing a section of a metal plate processed according to this embodiment, and FIG. 11 is a flowchart for explaining steps of processing the lead frame. Note that while the inner leads 103 (see FIG. 2) which have the narrowest pitch and the finest width in the lead frame are primarily processed in this embodiment, other portions than the inner leads 103 may be processed in a similar manner.

First, preparation for processing is made in step S31 of FIG. 11. More specifically, a belt-shaped metal plate rolled into the form of a coil and made of, e.g., steel, copper alloy, 42 Alloy or Kovar is leveled by being passed through a leveler to eliminate a tendency of the plate to curve. Subsequently, the surfaces of the metal plate are cleaned to remove dirt, oil and so on. By thus employing a belt-shaped metal plate rolled into the form of a coil as a material, a number of lead frames can be continuously processed while unrolling the coiled metal plate.

Next, a resist process is carried out in step S32. More specifically, a resist resin is coated on both surfaces of the metal plate 101 and dried to cover both the surfaces of the metal plate 101 with resist films 61. A protective film 65 for laser cutting is coated over each of the resist films 61. The protective film 65 for laser cutting is easily dissolved with an etchant and comprises carbon powder mixed with an adhesive. However, the protective film for laser cutting may comprise a resin which is easily dissolved with a solvent as with the second embodiment, or a metal or the like plated over the resist film 61, or a resin made of a different material from that of the resist film 61 and coated thereon. FIG. 10A shows the condition where step 32 is finished.

Figure 12:
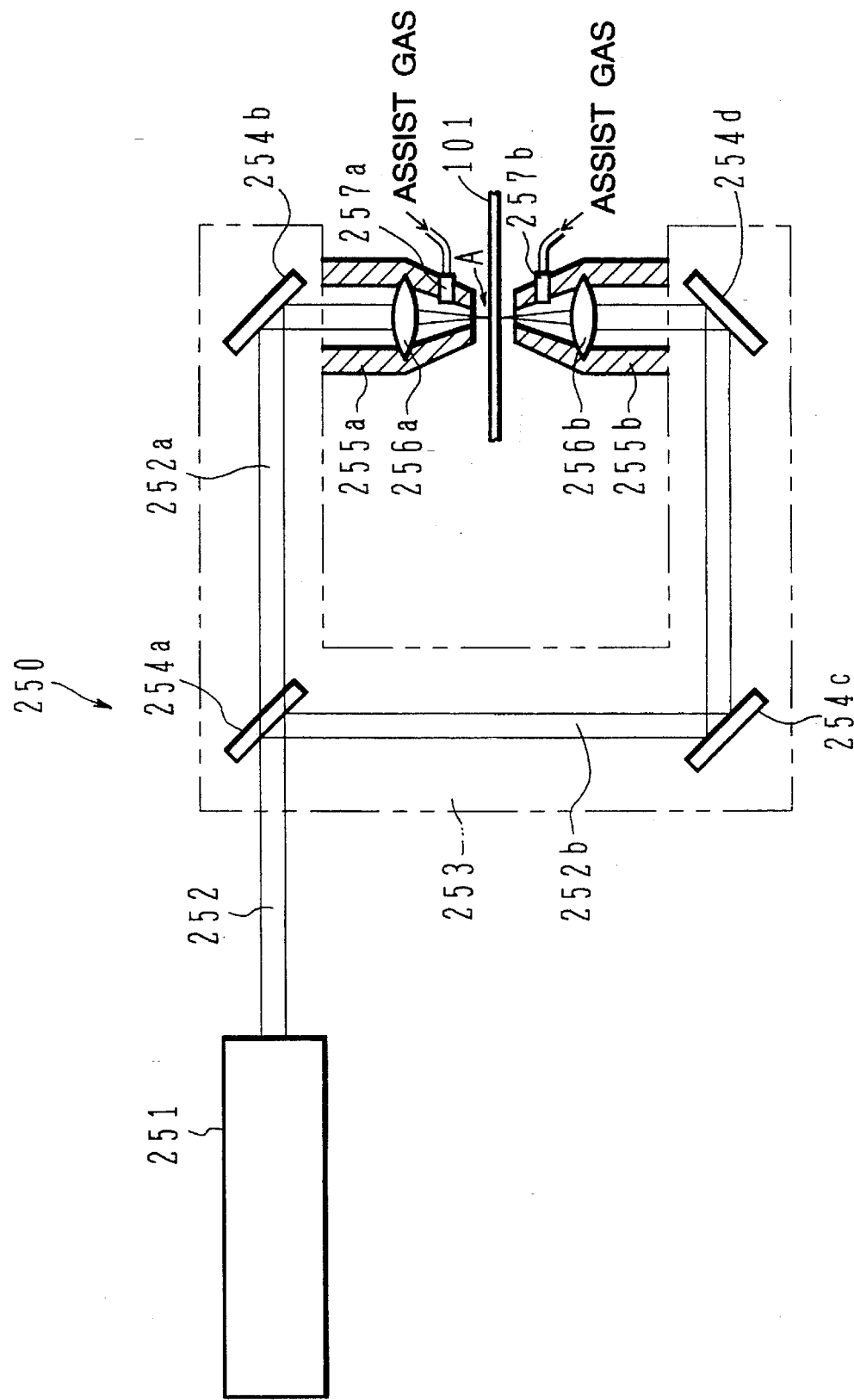
FIG. 12 is a view showing one example of an optical system of a laser cutting apparatus used in step S33 of FIG. 11.

Then, laser cutting is carried out in step S33. One example of a laser optical system of a laser cutting apparatus used in this step is shown in FIG. 12. Since laser beams are simultaneously irradiated to the metal plate from both sides in this embodiment, a beam splitting unit as shown in FIG. 12 is additionally provided and two nozzles are disposed one on each side. The remaining arrangement may be of the same one as employed in a laser cutting apparatus of conventional type generally known in the art.

In FIG. 12, a laser optical system 250 comprises a laser oscillator 251, a light splitting unit 253, and nozzles 255a, 255b. A laser beam 252 generated by the laser oscillator 251 enters a semi-transmission mirror 254a disposed in the light splitting unit 253 which doubles as a working head. The semi-transmission mirror 254a has transmissivity of 50%, and the remaining beam of 50% not passing through the mirror is reflected thereby. A laser beam 252a passing through the semi-transmission mirror 254a enters a bending mirror 254b which reflects the laser beam 252a for guiding it toward the metal plate 101. The laser beam 252a then enters a condensing lens 256a disposed in the nozzle 255a, by which it is condensed to such an extent as enough to provide an energy density required to enable laser cutting. The condensed laser beam is irradiated from a distal end of the nozzle 255a to the metal plate 101.

On the other hand, a laser beam 252b reflected by the semi-transmission mirror 254a is reflected again by a bending mirror 254d which further reflects the laser beam 252b for guiding it toward the metal plate 101. As with the laser beam 252a, the laser beam 252b is condensed by a condensing lens 256b disposed in the nozzle 255b so as to be irradiated to the metal plate 101. Furthermore, the nozzles 255a and 255b are provided with respective assist gas supply ports 257a and 257b so that an assist gas is ejected from each nozzle distal end in surrounding and coaxial relation to the laser beam.

The laser beams 252a and 252b emitted respectively from the nozzles 255a and 255b can be condensed by the condensing lenses 256a and 256b into a very small diameter. Also, the laser beams have their optical axes which are perpendicular to the metal plate 101 and aligned to lie on the same straight line. Thus, the optical axes of the laser beams 252a and 252b are coaxially arranged to be perpendicular to the metal plate 101. With such an arrangement, the laser beams 252a and 252b are simultaneously irradiated to the same position B on the metal plate 101 to be cut such that the positions irradiated by the two beams are accurately aligned with each other without causing any offset therebetween.

In step S33 of FIG. 11, the laser cutting apparatus constructed as above is first made prepared by setting various conditions such as the oscillation period and the energy density of the laser beam 252, the focus positions of the condensing lenses 256a, 256b, the pressures of the assist gases, and the position to be cut.

Figure 13:
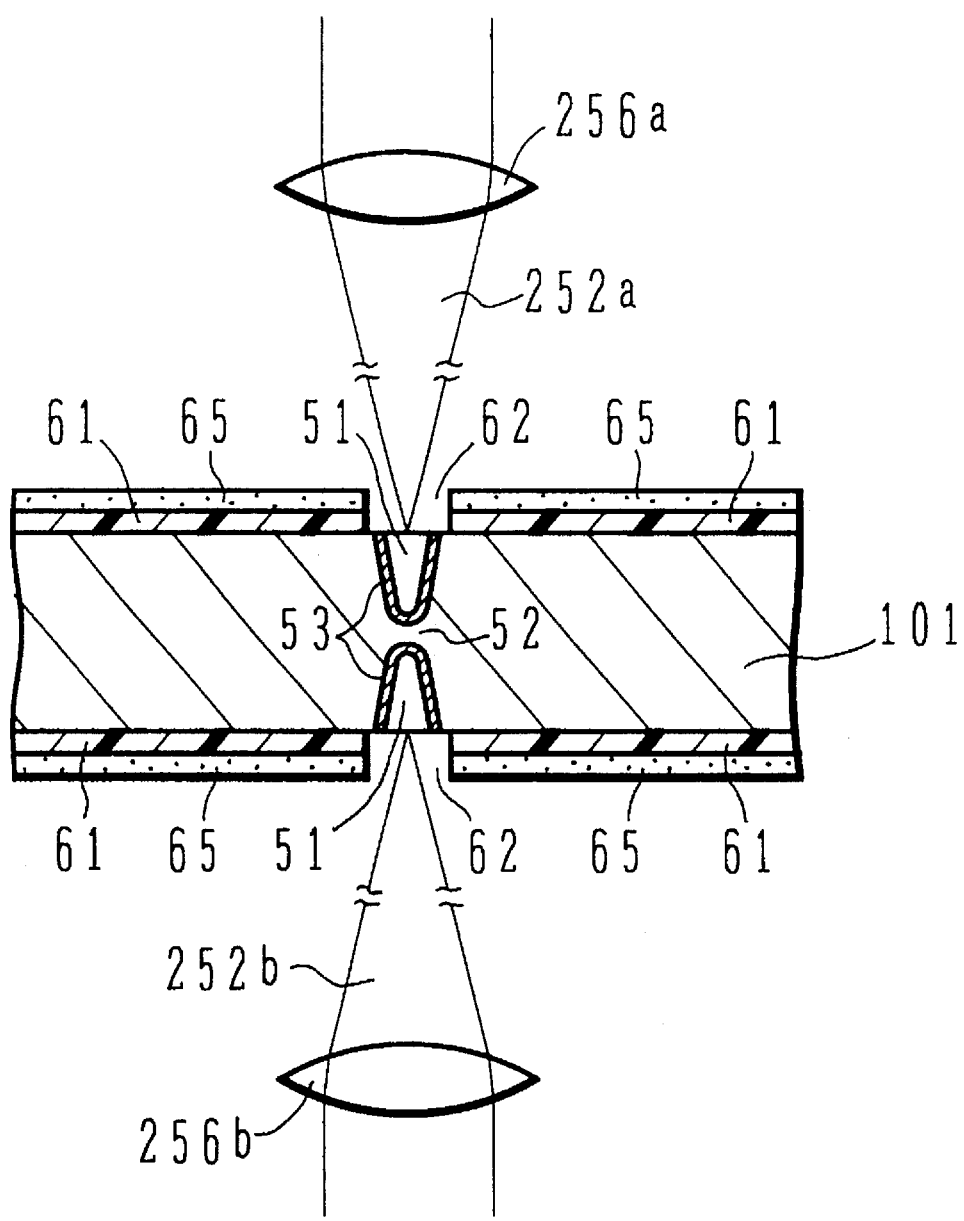
FIG. 13 is a Conceptual view showing a section of the metal plate cut through by the laser cutting apparatus having the optical system shown in FIG. 12.

Subsequently, the metal plate 101 is laser-cut by the laser cutting apparatus. FIG. 13 is a conceptual view showing a section of the metal plate subject to laser cutting at this time. In FIG. 13, the laser beams 252a, 252b are condensed respectively by the condensing lenses 256a, 256b to be able to supply a sufficient amount of thermal energy. The protective films 65 for laser cutting and the resist films 61 on both sides of the metal plate 101 are simultaneously cut with the heat produced under irradiation of the laser beams to form openings 62 larger than the beam diameters of the laser beams 252a, 252b. Then, portions of the surfaces of the metal plate 101 irradiated by the laser beams are molten and serves as heat sources such that the molten portions are progressed gradually from the plate surfaces in a direction of depth and cut grooves 51 are simultaneously formed in the opposite surfaces of the metal plate 101. The cut grooves 51 are formed to such an extent as not penetrate the metal plate 101 in the direction of plate thickness, and the portion not yet cut and remained at the bottoms of the cut grooves 51 becomes a joint 52. FIG. 10B shows a condition where a plurality of openings 62, cut grooves 51 and joints 52 are formed as a result of carrying out the above-described laser cutting successively. In this embodiment, the affected layers 52, oxide coatings (not shown) and some drosses (not shown) are also produced under the thermal effect due to irradiation of the laser beams 252a, 252b.

At this time, since the cut grooves 51 formed as described above may have a size smaller than that of the openings 62 formed in the resist films 61, and the not-through cut grooves 51 are formed in the metal plate 101 by irradiation of the laser beams 252a, 252b while leaving the joints 52 between the bottoms of the cut grooves 51, the amount of heat produced by the laser beams can be made very small. Accordingly, the area suffering the effect of the heat produced by the laser beams can be so reduced that the portions of the metal plate subject to the laser cutting cause no thermal deformations.

In most cases, the resist films 61 are not sufficiently resistant against heat and, even if the heat produced by the laser beams is reduced, the resist films are inevitably damaged under the effect of the heat. Also, the resist films 61 may be bored by drosses or sputters produced during the laser Gutting. This leads to a fear that the drosses or the sputters may deposit to the bored portions in the surfaces of metal plate 101, or that the etching may be progressed through the holes in the resist films 11 during the etching step. In this embodiment, since the protective films 65 for laser cutting are coated on the resist films 61, the above-mentioned drawback of possibly damaging the resist films 61 can be avoided.

Figure 14:
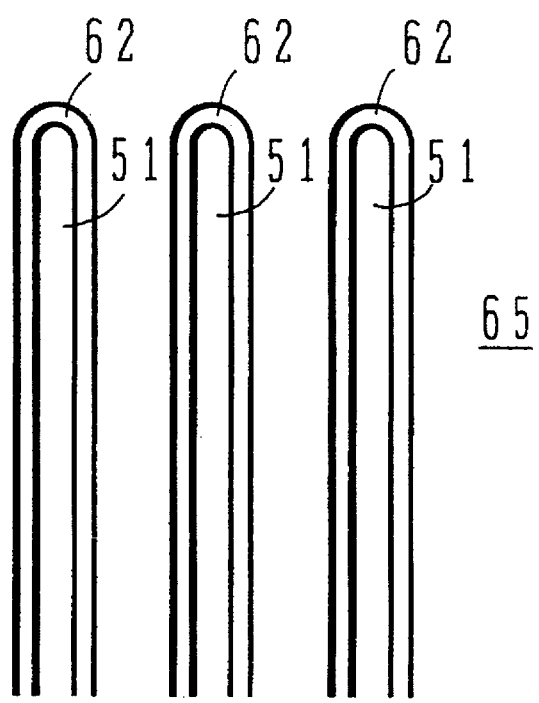
FIG. 14 is a view showing one example of regions of inner leads near their distal ends after being laser-cut in step 33 of FIG. 11.

In the laser cutting step, the metal plate 101 is cut successively by moving the metal plate 101 or the position irradiated by the laser beams once the openings 62, the cut grooves 51 and the joints 52 are formed. The openings 62 in the resist films 61 serve as an etching pattern corresponding to the configuration of the lead frame shown in FIG. 2. Subsequently, the surfaces of the metal plate 101 are cleaned. Note that the above-described laser cutting is applied to at least the inner leads 103 shown in FIG. 2, i.e., the portions of the lead frame which have a narrow pitch and demand a strict degree of dimensional accuracy and cleanness. The other portions in a relatively large pattern may be formed by a conventional etching or punching process. FIG. 14 shows, by way of example, the vicinity of distal end portions of the inner leads 103 having been laser-cut as described above.

Then, etching is carried out in step S34. When an etchant is supplied to the metal plate 101, the protective films 65 for laser cutting are dissolved with the etchant to be easily removed. In the case of using a protective film for laser cutting which is made of a material not dissolved with the etchant, the protective film can be removed by mechanically peeling it off, or dissolving it with a suitable solvent, or cleaning it in the cleaning step after the laser cutting. After removing the protective films 65 for laser cutting, the clean surfaces of the resist films 61 are exposed so that the etching is progressed in a sound condition.

In this step S34, the etching is progressed starting from the surfaces of the cut grooves 51 formed by the laser cutting. Then, the cut grooves 51 are extended to remove etched portions 54 along with the joints 52 shown in FIG. 10C so that the cut grooves 51 not yet penetrating the metal plate 101 in the direction of plate thickness now penetrate therethrough. Finally, the gaps 103a are defined to form the inner leads 103. At this time, the drosses 4, the affected layers 5 and the oxide coatings formed on the metal plate 101 during the laser cutting are also removed by the etchant, thereby providing the smooth surfaces.

Meanwhile, as described before in connection with the first embodiment, there has been a problem that a conventional process using etching only has a limit in processing and, when processing fine portions of a metal plate from both sides by etching only, the metal plate cannot be penetrated with a gap width less than the plate thickness.

In contrast, this embodiment is arranged to irradiate the laser beams 252a, 252b which can be condensed into a very small diameter and to previously form the cut grooves 1 which are narrow to such an extent as exceeding the processing limit in the prior art. Therefore, the etching is progressed starting from the surfaces of the cut grooves 51, resulting in that the amount to be cut by etching in the direction of plate thickness is reduced and the amount by which the metal plate is corroded by side etching is also reduced. Consequently, the width of the finally formed gaps can be made equal to or less than the plate thickness.

Further, since the cut grooves of the same configuration are formed in both surfaces of the metal plate 101, the etching is simultaneously progressed from both sides of the metal plate 101. As a result, the time required for the etching is shortened and the amount corroded by side etching is reduced in comparison with the case where the etching is progressed from one side of the metal plate. This also ensures that the width of the finally formed gaps can be made equal to or less than the plate thickness.

In this embodiment, if the (minimum) thickness of the joints 52 formed by the laser cutting in step S33 is selected to be twice or more that of the affected layers 5 formed under the thermal effect of the laser beam 202, it is theoretically concluded that the affected layers 5 are all corroded to disappear before the joints 52 are removed away, and hence the metal plate 101 is prevented from deforming due to residual strains and residual stresses. However, the joints 52 are inherently required to be sufficiently thick in this embodiment, because the joints 52 are momentarily evaporated or blown off by the assist gases if they are so thin. Accordingly, with no need of considering that the thickness of the joints 52 should be twice or more that of the affected layers which are very thin (5 to 25 μm with respect to a metal plate beings 0.15 mm thick), the joints 52 are ensured to have a sufficient thickness and the above-described condition is always satisfied.

After the completion of the above etching step, the resist films 61 are removed. The condition resulted at this time is shown in FIG. 10D. Subsequently, the metal plate 101 is subject to cleaning and drying to remove the drosses, the oxides and so on which have not been fully removed by the etching, thereby completing the processing of the metal plate 101. Since the etching is a non-thermal process, the metal plate 101 can realize a satisfactory smooth processed configuration and a high degree of dimensional accuracy after the processing without causing any thermal deformations.

Finally, the configuration of the metal plate processed as described above, i.e., of the lead frame, is inspected in step S35.

With this embodiment described above, since the non-penetrating cut grooves 51 are formed by irradiation of the laser beams while leaving the joints 52 between the bottoms of the cut grooves, the amount to be cut by the laser beam can be reduced and the area suffering the effect of the heat produced by the laser beam can be made very small so as to reduce resultant thermal deformations, in comparison with the prior art in which a metal plate is formed into the final desired configuration by using a laser beam only. Also, thermal deformations will not be accumulatively increased to eventually cause a substantial error in dimension. Further, the presence of the joints 52 between the bottoms of the cut grooves 51 keeps the metal plate 101 in a highly rigid state, allowing the metal plate to be easily handled. This is also effective to prevent deformations and manufacturing errors occurred during the processing.

Since etching (chemical corrosion) as a non-thermal process is finally carried out, the thermal effect is not produced and the drosses, the affected layers, the oxide coatings, etc. are removed, whereby the finally remained portions have a satisfactory processed configuration and the dimensional accuracy is improved, as with the first embodiment.

Since the protective films 65 for laser cutting are coated over the resist films 61, the resist films 61 are prevented from being damaged by the heat incidental to the laser cutting. Also, the resist films 61 will not be bored by drosses or sputters produced during the laser cutting, thus eliminating a fear that the drosses or the sputters may deposit to the surfaces of metal plate, or that the etching may be progressed into the portions other than intended. Further, since the protective films 65 for laser cutting are dissolved with the etchant, they can be easily removed in the etching step. After removing the protective films 65 for laser cutting, the clean surfaces of the resist films 61 are exposed so that the etching is progressed in a sound condition.

Since the optical axes of the laser beams 252a and 252b are coaxially arranged with respect to the metal plate 101, the same etching pattern can be simultaneously formed from both front and rear surfaces of the metal plate 101 to finish the laser cutting in a shorter time, and the cut grooves 51 in both front and rear surfaces of the metal plate 101 can be accurately aligned with each other without causing any offset therebetween. In this case, since the etching is simultaneously progressed from both sides of the metal plate 101, the time required for the etching is shortened and the amount corroded by side etching is reduced in comparison with the case where the etching is progressed from one side of the metal plate.

Moreover, since the openings 62 formed in the resist films 61 each serves as an etching pattern, many steps, including a step of forming an original plate, which have been essential in the case of forming an etching pattern by a conventional photoresist process, are not necessary, and the need of forming an original plate for each change in the etching pattern is eliminated. Additionally, since the cut grooves 51 which are narrow to such an extent as exceeding the processing limit in the prior art are previously formed by utilizing the fact that the laser beam can be condensed into a very small diameter, the amount to be cut by etching in the direction of plate thickness is reduced and the amount by which the metal plate is corroded by side etching in parallel is also reduced. Consequently, the width of the finally formed gaps can be made equal to or less than the plate thickness.

Fifth Embodiment

A fifth embodiment of the present invention will be described below with reference to FIGS. 15 to 17. In this embodiment, a semiconductor device is manufactured by using a lead frame which is formed by cutting out a metal plate in an appropriate pattern.

Figure 15:
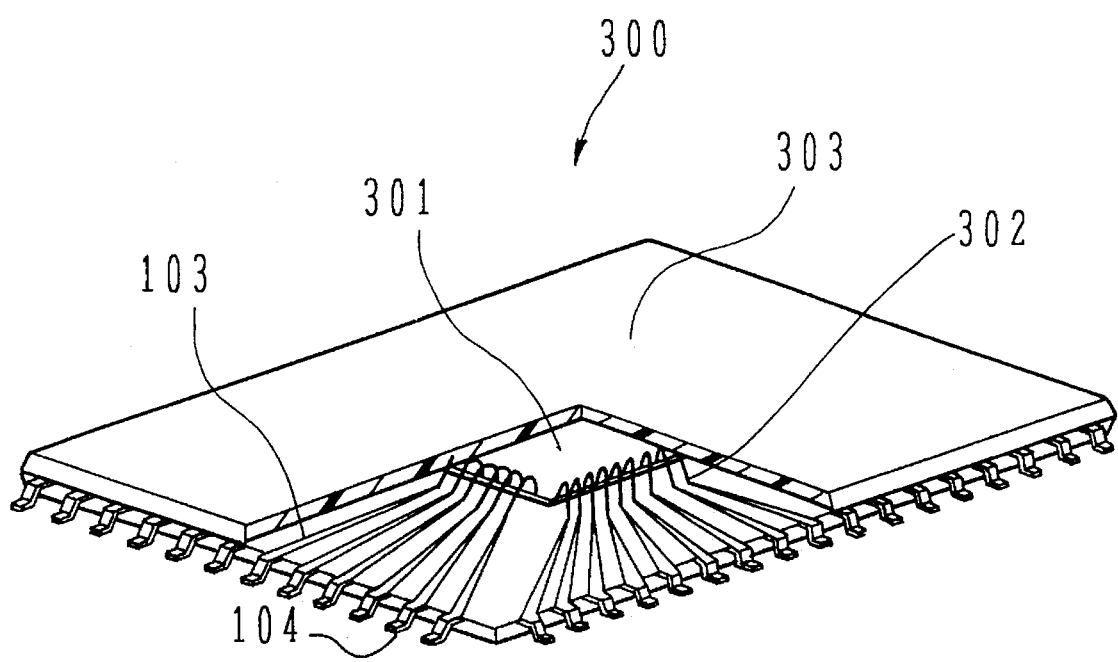
FIG. 15 is a view showing the construction of a semiconductor device manufactured with a fifth embodiment of the present invention.

FIG. 15 is a view showing the construction of a semiconductor device manufactured according to this embodiment. In a semiconductor device 300, a semiconductor chip 301 is mounted on the die pad 102 (see FIG. 2), the inner leads 103 are electrically connected to terminals of the semiconductor chip 301 by wires 302 such as gold wires, and a section including the semiconductor chip 301 and the inner leads 103 is sealed off by a resin molding 303. The outer leads 104 are individually divided from each other by cutting away the dam bars 105 (see FIG. 2), and are bent outwardly of the resin molding 303. The bent portions of the outer leads 104 are connected to a circuit pattern on a printed board when the semiconductor device 300 is later mounted on the printed board.

Figure 16:
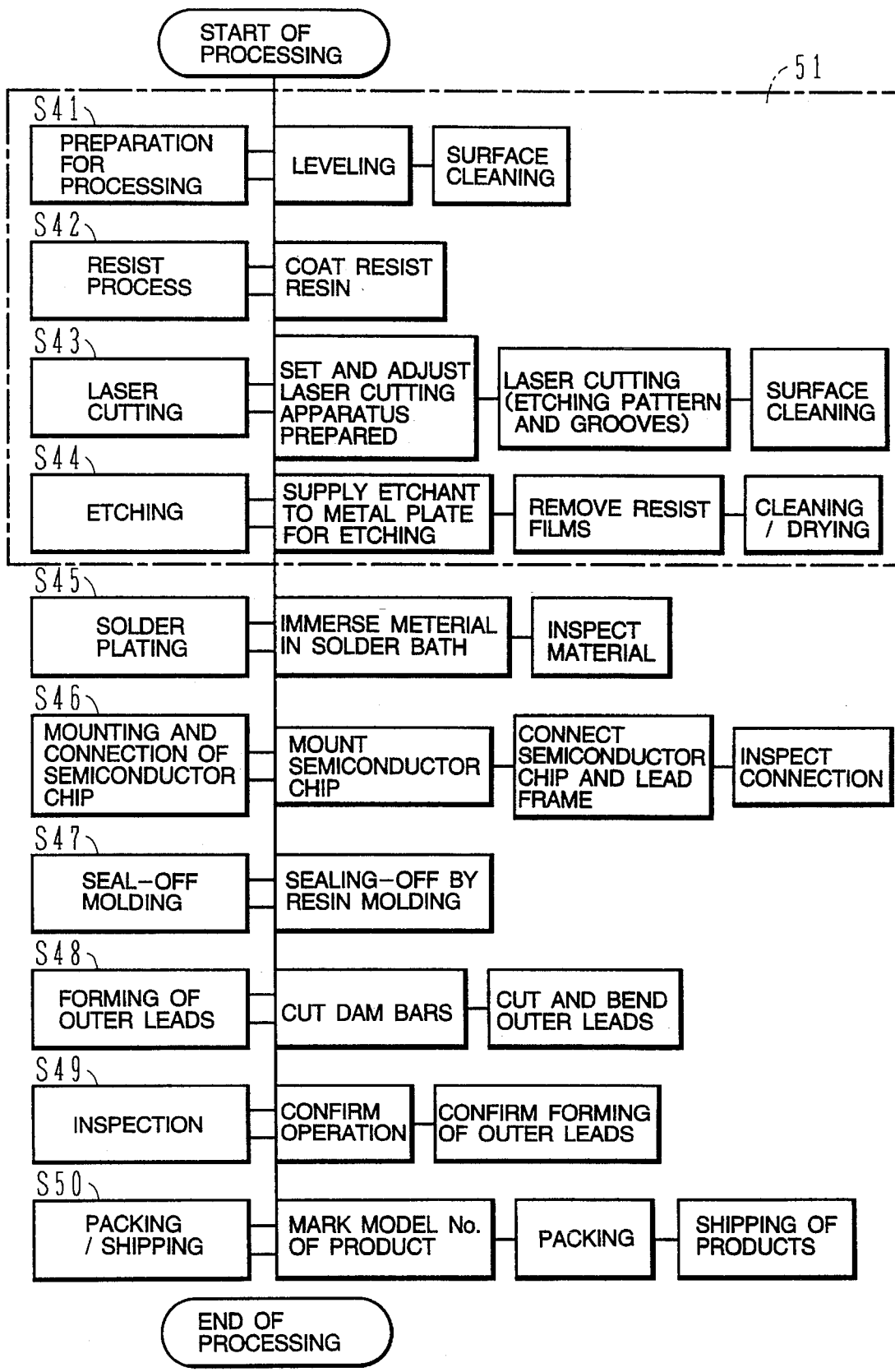
FIG. 16 is a flowchart showing manufacturing steps of the semiconductor device shown in FIG. 15.
Figure 17:
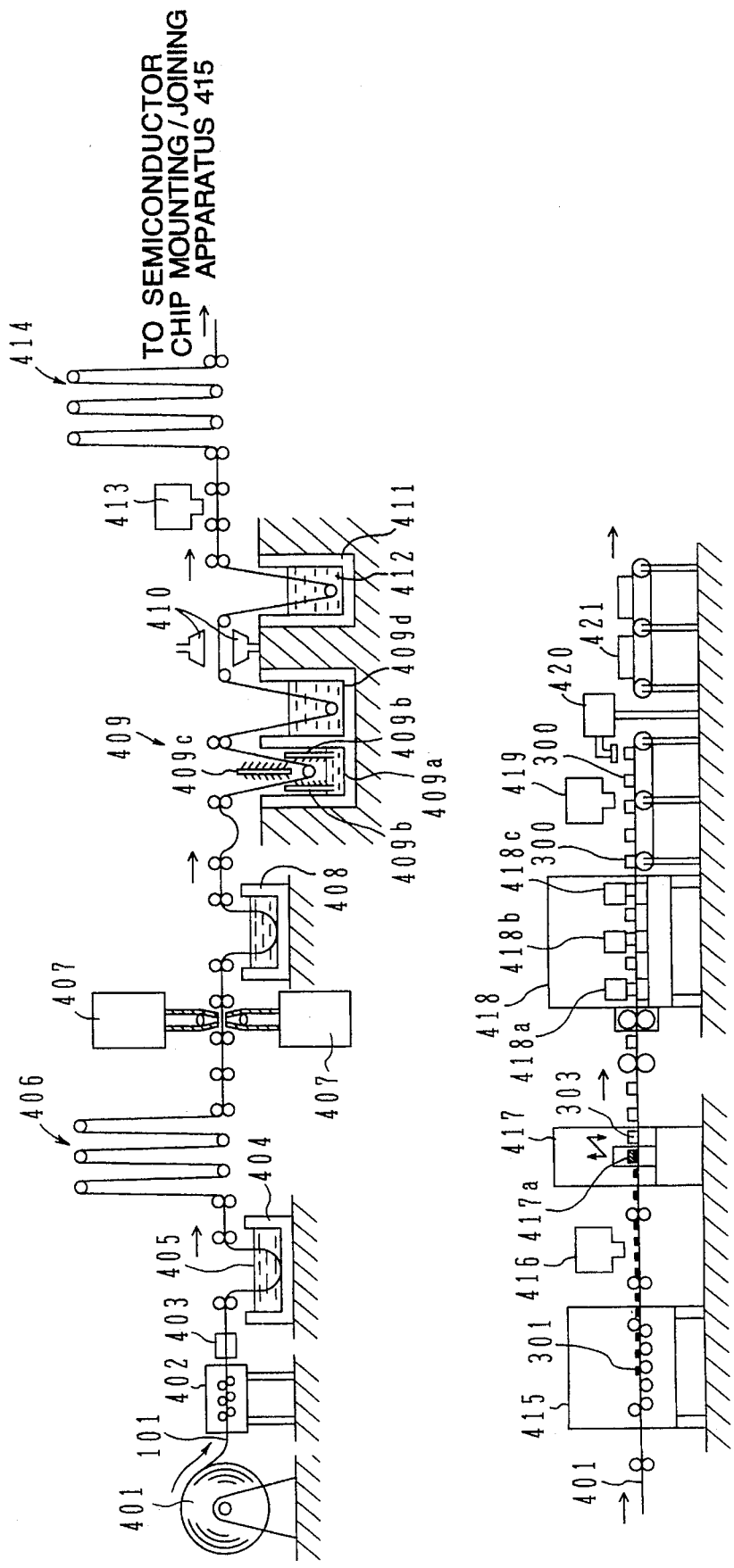
FIG. 17 is a view for explaining manufacturing steps of the semiconductor device shown in FIG. 15.

FIGS. 16 and 17 are views for explaining a method of manufacturing the above semiconductor device.

First, preparation for processing is made in step S41 of FIG. 16. More specifically, a metal plate 101 made of, e.g., steel, copper alloy, 42 Alloy or Kovar is unrolled from a coil 401 and then passed through a leveler 402 to eliminate a tendency of the plate to curve. Subsequently, the surfaces of the metal plate 101 are cleaned in a cleaning apparatus 403 to remove dirt, oil and so on. In this embodiment, a number of lead frames can be continuously processed while unrolling the belt-shaped metal plate 101 from the coil 401 as mentioned above.

Next, in step S42, the metal plate 101 is immersed in a resist resin tank 404 to coat a resist resin 405 on both surfaces of the metal plate 101, the resist resin being then dried to become resist films. The metal plate 101 is transferred to a laser cutting apparatus 407 while being adjusted in a feed speed through a material stocker 406.

Then, laser cutting is carried out in step S43. The laser cutting apparatus 407 used here is the same one as described before by referring to FIG. 4 or 12. The laser cutting apparatus 407 is made prepared beforehand by setting various conditions for the laser cutting. These conditions are adjusted as occasions demands upon, e.g., change in materials. Subsequently, in a similar manner as in step S3 of FIG. 3 or step S33 in FIG. 11, through holds or cut grooves corresponding to the configuration of a lead frame are formed by the laser cutting apparatus 47. After that, the metal plate 101 is immersed in a cleaning tank 408 to clean the plate surfaces.

Next, etching is carried out in step S44. More specifically, the metal plate 101 is transferred to an etching tank 409a of an etching apparatus 409. An etchant in the etching tank 409a is injected to the surfaces of the metal plate 101 from injection devices 409b and 409c to thereby form gaps of a desired shape. At this time, the etching is progressed in a similar manner as in the foregoing four embodiments. The etched metal plate 101 is immersed in a resist film removing tank 409d of the etching apparatus 409 where the resist films are removed and, simultaneously, the exposed surfaces are cleaned. At this time, drosses, oxides, etc. which have not been fully removed by the etching are also removed. The cleaned metal plate 101 is dried in a drying machine 410. The above-described process S51 (indicated by two-dot-chain lines in FIG. 16) from step S41 to step S44 are similar to that described in connection to FIG. 3 or FIG. 11. At this point, a number of lead frames in accordance with the etching pattern formed in step S43 are successively formed in the metal plate 101.

Next, a solder is plated in step S45. More specifically, the metal plate 101 having a number of lead frames successively formed therein is immersed in a solder tank 411 where a solder 412 is plated on the surfaces of the metal plate 101. This solder plating step is to facilitate subsequent electrical connection between the lead frames and semiconductor chips or the like. Instead of solder plating, gold, silver or the like may be plated. After that, the metal plate 101 is transferred to an inspecting apparatus 413 where the processed configuration of each lead frame and the condition of the plated solder are inspected. Subsequently, the metal plate 101 is transferred to a semiconductor chip mounting-joining apparatus 415 while being adjusted in a feed speed through a material stocker 414.

Next, semiconductor chips are mounted and connected in step S46. More specifically, in the semiconductor chip mounting-joining apparatus 415, the semiconductor chip 301 is mounted to each of the lead frames successively formed in the metal plate 101, and terminals of the semiconductor chip 301 are connected respectively to leading ends of the inner leads 103 of each lead frame. Then, the connected condition between the terminals of the semiconductor chip 301 and the inner leads 103 is inspected by an inspecting apparatus 416.

Next, in step S47, the semiconductor chip 301 and the inner leads 103 connected to each other as described above are integrally sealed off by using a molding resin 417a in a seal-off molding apparatus 417 to form a resin molding 303 (see FIG. 15).

Next, in step S48, the outer leads 104 are shaped by a forming apparatus 418. More specifically, the dam bars 105 (see FIG. 2) interconnecting and supporting the adjacent outer leads 104 are cut away by a dam bar cutting apparatus 418a, outer peripheral portions of the outer leads 104 are severed from the metal plate 101 by a dividing apparatus 418b so that the lead frames are individually divided from each other, and further the outer leads 104 are bent by a bending apparatus 418c. At this point, manufacture of the multiplicity of semiconductor devices 300 is completed.

Next, in step S49, the semiconductor devices 300 are transferred to an inspecting apparatus 419 to finally confirm operation of each semiconductor device and the bent configuration of the outer leads. Then, in step S50, only good products are marked with the model numbers and are packed in a cartridge 421 by a robot 420 to provide a final product.

The method of manufacturing semiconductor devices according to the present invention is similar to the TAB (Tape Automated Bonding) method conventionally known in the art. In the TAB method, a plastic film of polyimide or the like including leads of metal foils formed thereon is used as basic feed means for mounting semiconductor chips. However, such a plastic film is expanded and contracted to a larger extent than a metal plate, resulting in relatively poor processing accuracy, the reduced rigidity and strength, and difficulties in handling. In contrast, since this embodiment employs, as basic feed means for mounting semiconductor chips, a metal plate which has the great strength, is hard to deform, and is subject to a small amount of expansion/contraction, the handling is facilitated and the processing accuracy is improved.

With this embodiment, since a number of lead frames each having desired gaps formed therein are successively formed in a metal plate by the processing method similar to that described above, and then a number of semiconductor devices are manufactured in successive steps of mounting and connecting semiconductor chips to the lead frames, sealing off the chips by molding, shaping outer leads, inspecting processed products and packing or shipping final products, mass production can be realized thoroughly from processing of the lead frames to manufacturing of the semiconductor devices, making it possible to manufacture a large number of semiconductor devices in a shorter time at the reduced cost.

Also, since after at least one of the above successive steps has been completed, the result of processing carried out in that step is inspected, product quality can be controlled for each step.

While the foregoing five embodiments have been described in connection with the case of forming lead frames from a metal plate, the metal plate processing method of the present invention is also applicable to the other cases of processing, rather than the lead frames, screen printing metal masks for use in transferring a solder in a desired pattern to printed boards, parts of magnetic heads, and leaf springs or spacers having desired configurations, for example.

INDUSTRIAL APPLICABILITY

According to the present invention, since laser cutting is performed in such a manner as to leave joints having a small thickness in part of wall surfaces of cut grooves formed by the laser cutting, the effect of heat produced incidental to the laser cutting can be reduced to diminish thermal deformations. Also, thermal deformations will not be accumulatively increased to eventually cause a substantial error in dimension unlike the prior art. Further, it is possible to keep the metal plate in a highly rigid state, allowing the metal plate to be easily handled, and hence to prevent deformations and manufacturing errors occurred during the processing.

Since etching as a non-thermal process is finally carried out, the thermal effect can be reduced and drosses, affected layers, oxide coatings, etc. can also be removed. Consequently, it is possible to obtain the satisfactory finished configuration and to improve the final dimensional accuracy.

According to the present invention, therefore, a metal plate can be easily processed with such fine and high dimensional accuracy as exceeding the processing limit in the prior art.

Moreover, according to the present invention, fine lead frames having a narrow pitch can be processed with a satisfactory degree of dimensional accuracy and cleanness. In addition, by processing a large number of lead frames successively using a belt-shaped metal plate and manufacturing semiconductor devices using the processed lead frames in successive steps consecutively in a shorter period of time, it is possible to realize mass production and a reduction in the cost.

We claim:

1. A metal plate processing method for forming gaps in a thin metal plate (101), the method comprising a first step of carrying out laser cutting by irradiating a laser beam (202, 252) to said metal plate (101) to form cut grooves (3, 51) such that a joint (6, 52) having a small thickness is left in part of wall surfaces of said cut grooves (3, 51), and a second step of chemically corroding the wall surfaces of said cut grooves (3, 51) to remove said joint (6, 52) to thereby form a gap (103*a*) in said metal plate (101).

2. A metal plate processing method according to claim 1, wherein said cut grooves (3) formed in said first step are through holes (3) discontinuously formed in said metal plate (101) in line, and said joint (6) is an uncut portion left between adjacent twos of said through holes.

3. A metal plate processing method according to claim 2, wherein the thickness of said joint (6) formed by the laser cutting in said first step is smaller than the thickness of said metal plate (101).

4. A metal plate processing method according to claim 1, wherein said cut grooves (51) formed in said first step are cut grooves (51) formed not to penetrate said metal plate (101) in the direction of plate thickness, and said joint (52) is an uncut portion left at the bottoms of said cut grooves.

5. A metal plate processing method according to claim 4, wherein said not-penetrating cut grooves (51) are formed from both sides of said metal plate (101).

6. A metal plate processing method according to claim 5, wherein optical axes of laser beams (252*a*, 252*b*) are coaxially disposed on both sides of said metal plate (101), and said laser beams (252*a*, 252*b*) are simultaneously irradiated to the same position on both surfaces of said metal plate (101).

7. A metal plate processing method according to claim 1, wherein prior to the laser cutting in said first step, a protective agent (65) for laser cutting is coated on the surface of said metal plate (101).

8. A metal plate processing method according to claim 1, wherein prior to the laser cutting in said first step, a protective agent (1, 61) resistant to chemical corrosion is coated on the surface of said metal plate (101).

9. A metal plate processing method according to claim 8, wherein prior to the laser cutting in said first step, a protective agent (65) for laser cutting is further coated on said protective agent (1, 61) resistant to chemical corrosion.

10. A metal plate processing method according to claim 1, wherein after the laser cutting in said first step, a protective agent (1, 61) resistant to chemical corrosion is coated on the surface of said metal plate (101).

11. A metal plate processing method according to claim 1, wherein after the laser cutting in said first step, residual thermal strains caused by the laser cutting are removed.

12. A metal plate processing method according to claim 1, wherein the thickness of said joint (6, 52) formed by the laser cutting in said first step is twice or more the thickness of affected layers (5, 53) formed in the wall surfaces of said cut grooves (3, 51) due to the heat produced during the laser cutting.

13. A metal plate processing method according to claim 1, wherein the width of said gap (103*a*) formed by the chemical corrosion in said second step is smaller than the thickness of said metal plate (101).

14. A metal plate processing method comprising a first step of correcting a belt-shaped metal plate (101) rolled into the form of a coil to be flat, a second step of carrying out laser cutting by irradiating a laser beam (202, 252) to said metal plate (101) to form cut grooves (3, 51) such that a joint (6, 52) having a small thickness is left in part of wall surfaces of said cut grooves (3, 51), a third step of coating a protective agent (1, 61) resistant to chemical corrosion on the surface of said metal plate (101) before or after the laser cutting in said first step, a fourth step of chemically corroding the wall surfaces of said cut grooves (3, 51) to remove said joint (6, 52) to thereby form a gap (103*a*), and a fifth step of removing said protective agent (1, 61) resistant to chemical corrosion on the surface of said metal plate (101) and subjecting the exposed surface to cleaning and drying, whereby a number of metal plates (101) each having said gaps (103*a*) are formed successively.

15. A lead frame processing method for forming, from a metal plate (101), a lead frame which has a number of inner leads (103) connected to respective terminals a semiconductor chip (301) and outer leads (104) extending outwardly of said inner leads (103) in continuous relation, wherein at least said inner leads (103) are formed by said metal plate processing method according to claim 1.

16. A lead frame manufactured by said lead frame processing method according to claim 15.

17. A semiconductor device manufacturing method comprising a first step of correcting a belt-shaped metal plate (101) rolled into the form of a coil to be flat, a second step of carrying out laser cutting by irradiating a laser beam (202, 252) to said metal plate (101) to form cut grooves (3, 51) such that a joint (6, 52) having a small thickness is left in part of wall surfaces of said cut grooves (3, 51), a third step of coating a protective agent (1, 61) resistant to chemical corrosion on the surface of said metal plate (101) before or after the laser cutting in said first step, a fourth step of chemically corroding the wall surfaces of said cut grooves (3, 51) to remove said joint (6, 52) to thereby form a gap (103*a*), a fifth step of removing said protective agent (1, 61) resistant to chemical corrosion on the surface of said metal plate and subjecting the exposed surface to cleaning and drying to thereby manufacture a number of lead frames each having said gaps (103*a*) successively, a sixth step of mounting semiconductor chips (301) to said individual lead frames and electrically connecting terminals of each of said semiconductor chips (301) to inner leads (103) of the corresponding lead frame, a seventh step of integrally sealing off each assembly of said semiconductor chip (301) and said inner leads (103) individually by a resin molding (303), and an eighth step of severing said individual lead frames from each other to manufacture a number of semiconductor devices (300) successively.

18. A semiconductor device manufacturing method according to claim 17, wherein after at least one of said first to eighth steps is completed, the result of processing carried out in that step is inspected.

19. A semiconductor device (300) manufactured by said semiconductor device manufacturing method according to claim 17.

20. A lead frame processing method for forming, from a metal plate (101), a lead frame which has a number of inner leads (103) connected to respective terminals a semiconductor chip (301) and outer leads (104) extending outwardly of said inner leads (103) in continuous relation, wherein at least said inner leads (103) are formed by said metal plate processing method according to claim 2.

21. A lead frame processing method for forming, from a metal plate (101), a lead frame which has a number of inner leads (103) connected to respective terminals a semiconductor chip (301) and outer leads (104) extending outwardly of said inner leads (103) in continuous relation, wherein at least said inner leads (103) are formed by said metal plate processing method according to claim 3.

22. A lead frame processing method for forming, from a metal plate (101), a lead frame which has a number of inner leads (103) connected to respective terminals a semiconductor chip (301) and outer leads (104) extending outwardly of said inner leads (103) in continuous relation, wherein at least said inner leads (103) are formed by said metal plate processing method according to claim 4.

23. A lead frame processing method for forming, from a metal plate (101), a lead frame which has a number of inner leads (103) connected to respective terminals a semiconductor chip (301) and outer leads (104) extending outwardly of said inner leads (103) in continuous relation, wherein at least said inner leads (103) are formed by said metal plate processing method according to claim 5.

24. A lead frame processing method for forming, from a metal plate (101), a lead frame which has a number of inner leads (103) connected to respective terminals a semiconductor chip (301) and outer leads (104) extending outwardly of said inner leads (103) in continuous relation, wherein at least said inner leads (103) are formed by said metal plate processing method according to claim 6.

25. A lead frame processing method for forming, from a metal plate (101), a lead frame which has a number of inner leads (103) connected to respective terminals a semiconductor chip (301) and outer leads (104) extending outwardly of said inner leads (103) in continuous relation, wherein at least said inner leads (103) are formed by said metal plate processing method according to claim 7.

26. A lead frame processing method for forming, from a metal plate (101), a lead frame which has a number of inner leads (103) connected to respective terminals a semiconductor chip (301) and outer leads (104) extending outwardly of said inner leads (103) in continuous relation, wherein at least said inner leads (103) are formed by said metal plate processing method according to claim 8.

27. A lead frame processing method for forming, from a metal plate (101), a lead frame which has a number of inner leads (103) connected to respective terminals a semiconductor chip (301) and outer leads (104) extending outwardly of said inner leads (103) in continuous relation, wherein at least said inner leads (103) are formed by said metal plate processing method according to claim 9.

28. A lead frame processing method for forming, from a metal plate (101), a lead frame which has a number of inner leads (103) connected to respective terminals a semiconductor chip (301) and outer leads (104) extending outwardly of said inner leads (103) in continuous relation, wherein at least said inner leads (103) are formed by said metal plate processing method according to claim 10.

29. A lead frame processing method for forming, from a metal plate (101), a lead frame which has a number of inner leads (103) connected to respective terminals a semiconductor chip (301) and outer leads (104) extending outwardly of said inner leads (103) in continuous relation, wherein at least said inner leads (103) are formed by said metal plate processing method according to claim 11.

30. A lead frame processing method for forming, from a metal plate (101), a lead frame which has a number of inner leads (103) connected to respective terminals a semiconductor chip (301) and outer leads (104) extending outwardly of said inner leads (103) in continuous relation, wherein at least said inner leads (103) are formed by said metal plate processing method according to claim 12.

31. A lead frame processing method for forming, from a metal plate (101), a lead frame which has a number of inner leads (103) connected to respective terminals a semiconductor chip (301) and outer leads (104) extending outwardly of said inner leads (103) in continuous relation, wherein at least said inner leads (103) are formed by said metal plate processing method according to claim 13.

32. A lead frame processing method for forming, from a metal plate (101), a lead frame which has a number of inner leads (103) connected to respective terminals a semiconductor chip (301) and outer leads (104) extending outwardly of said inner leads (103) in continuous relation, wherein at least said inner leads (103) are formed by said metal plate processing method according to claim 14.

33. A semiconductor device (300) manufactured by said semiconductor device manufacturing method according to claim 18.

* * * * *